(12) United States Patent
Tsang et al.

(10) Patent No.: US 11,270,904 B2
(45) Date of Patent: Mar. 8, 2022

(54) SUBSTRATE PROCESSING APPARATUS

(71) Applicant: BROOKS AUTOMATION, INC., Chelmsford, MA (US)

(72) Inventors: Vincent W. Tsang, Lincoln, MA (US); Charles W. Su, Stratham, NH (US)

(73) Assignee: BROOKS AUTOMATION US, LLC, Chelmsford, MA (US)

( * ) Notice: Subject to any disclaimer, the term of this patent is extended or adjusted under 35 U.S.C. 154(b) by 0 days.

(21) Appl. No.: 15/634,871

(22) Filed: Jun. 27, 2017

(65) Prior Publication Data

US 2018/0019155 A1 Jan. 18, 2018

Related U.S. Application Data

(60) Provisional application No. 62/361,325, filed on Jul. 12, 2016.

(51) Int. Cl.
| | |
|---|---|
| *H01L 21/67* | (2006.01) |
| *H01L 21/687* | (2006.01) |
| *H01L 21/677* | (2006.01) |
| *B25J 9/10* | (2006.01) |
| *B25J 9/04* | (2006.01) |
| *B25J 9/16* | (2006.01) |

(52) U.S. Cl.
CPC ........ *H01L 21/68707* (2013.01); *B25J 9/043* (2013.01); *B25J 9/104* (2013.01); *B25J 9/1682* (2013.01); *H01L 21/67167* (2013.01); *H01L 21/67196* (2013.01); *H01L 21/67742* (2013.01)

(58) Field of Classification Search
CPC ...................................................... B25J 9/0043
See application file for complete search history.

(56) References Cited

U.S. PATENT DOCUMENTS

| | | | |
|---|---|---|---|
| 9,064,919 B2 | 6/2015 | Yazawa et al. | |
| 9,746,057 B2 | 8/2017 | Mu et al. | |
| 2007/0029504 A1* | 2/2007 | Saito | H01J 37/18 250/441.11 |

(Continued)

FOREIGN PATENT DOCUMENTS

| | | |
|---|---|---|
| CN | 104948687 | 9/2015 |
| JP | 2000237986 | 9/2000 |
| JP | 2007042799 | 2/2007 |

(Continued)

*Primary Examiner* — Ronald P Jarrett
(74) *Attorney, Agent, or Firm* — Perman & Green, LLP; Colin C. Durham

(57) ABSTRACT

A substrate processing apparatus including a frame, a first SCARA arm having an end effector and being configured to extend and retract along a first axis, a second SCARA arm having an end effector and being configured to extend and retract along a second axis, a drive section including a splitting drive pulley rotatably mounted to rotate at an axis of rotation of the drive section that is shared by the first and second SCARA arms, the splitting drive pulley being coupled to at least two idler pulleys by respective segmented transmission loops of separate band segments so that the splitting drive pulley is a common pulley splitting one degree of freedom of the drive section between the at least two idler pulleys so as to commonly drive the at least two idler pulleys, wherein at least one band of each respective transmission loop share a common band interface level.

34 Claims, 26 Drawing Sheets

(56) References Cited

U.S. PATENT DOCUMENTS

2014/0010625 A1* 1/2014 Hudgens ............... B25J 18/00
                                                                               414/749.1
2015/0128749 A1 5/2015 Gilchrist

FOREIGN PATENT DOCUMENTS

| | | |
|---|---|---|
| JP | 5480562 | 4/2014 |
| JP | 2014509083 | 4/2014 |
| WO | 2012125572 | 9/2012 |

* cited by examiner

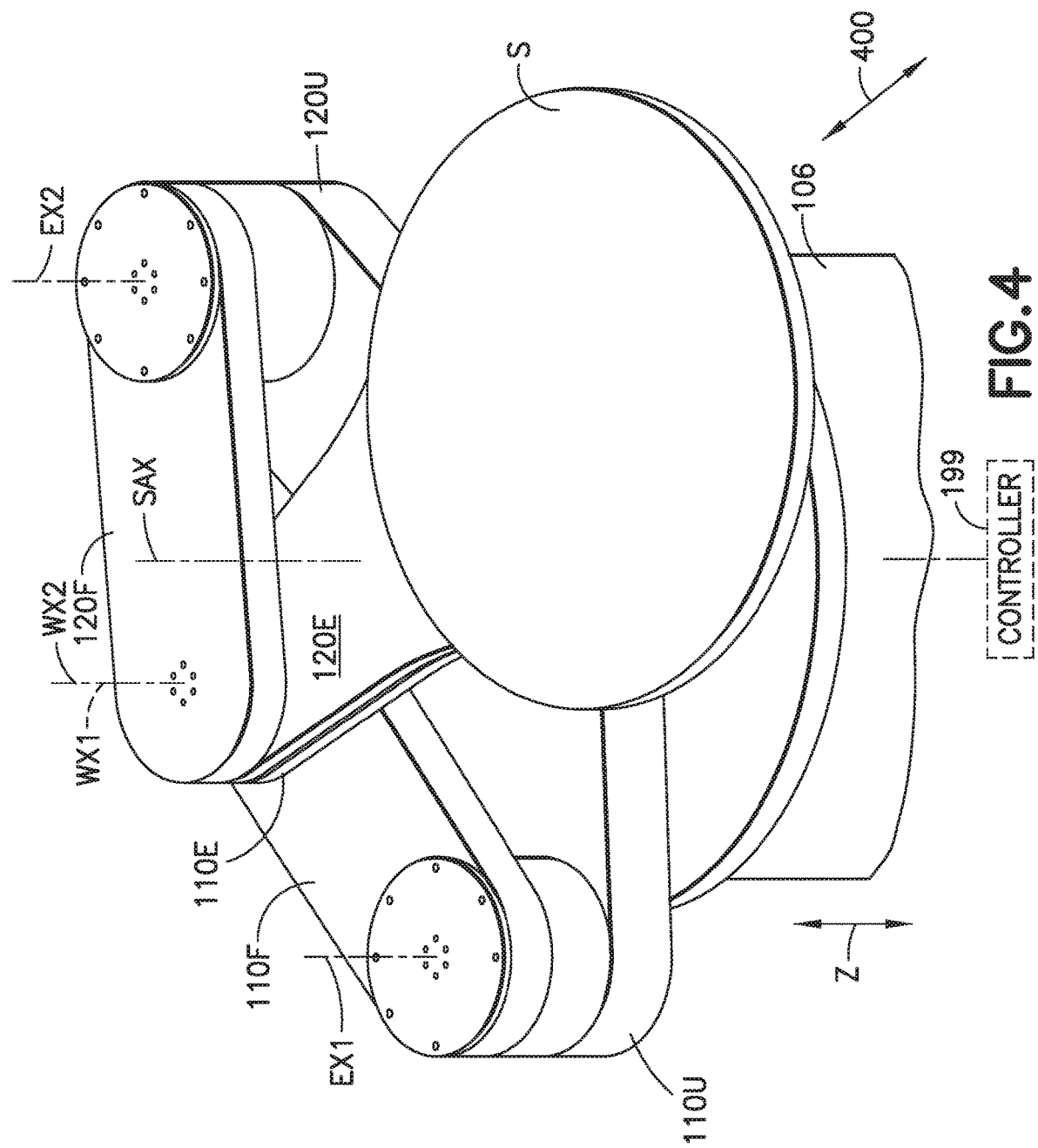

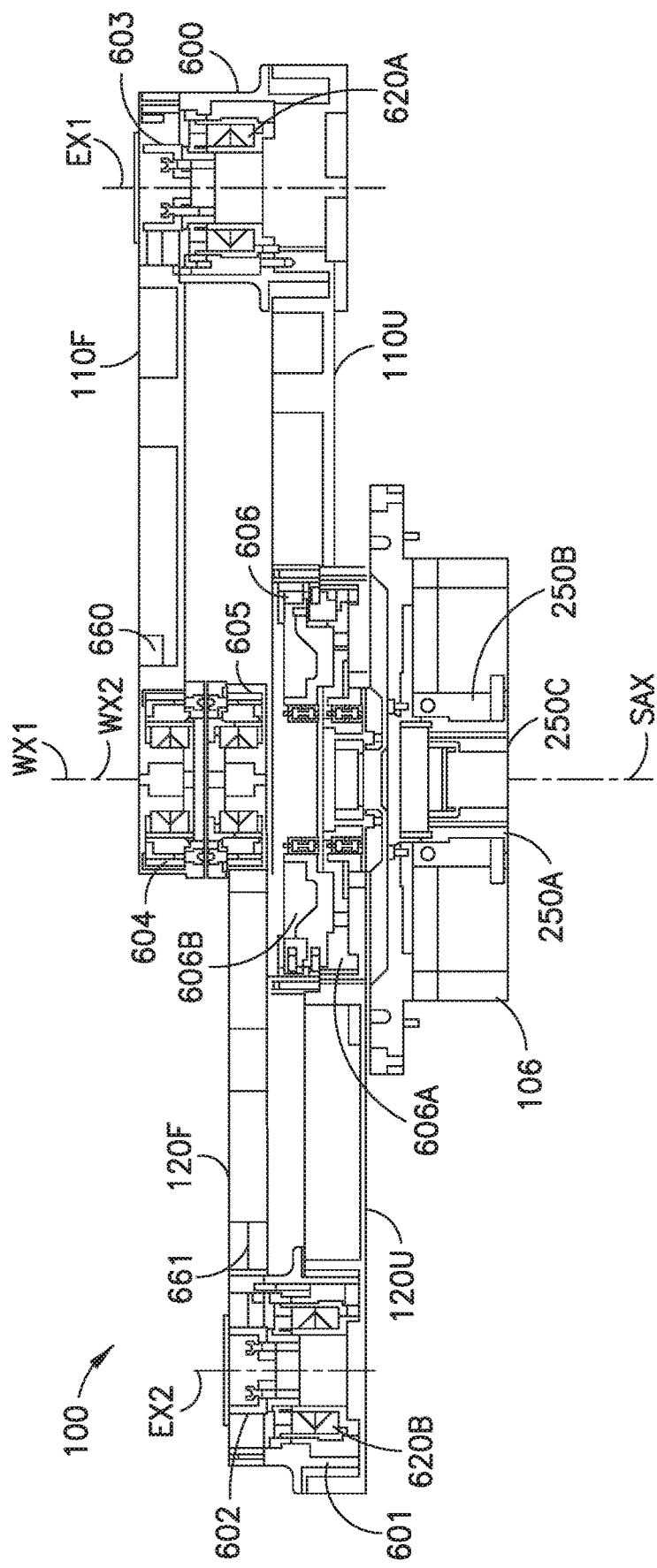

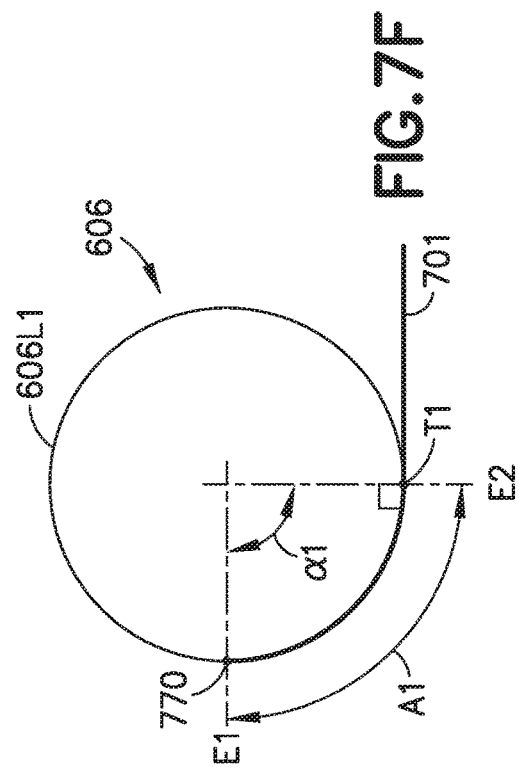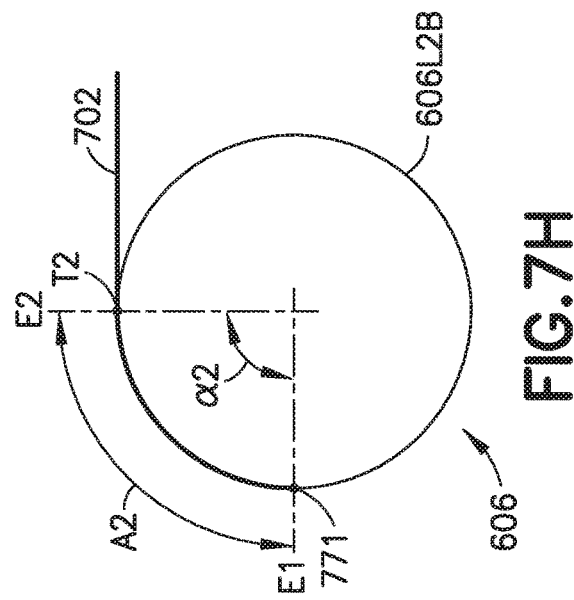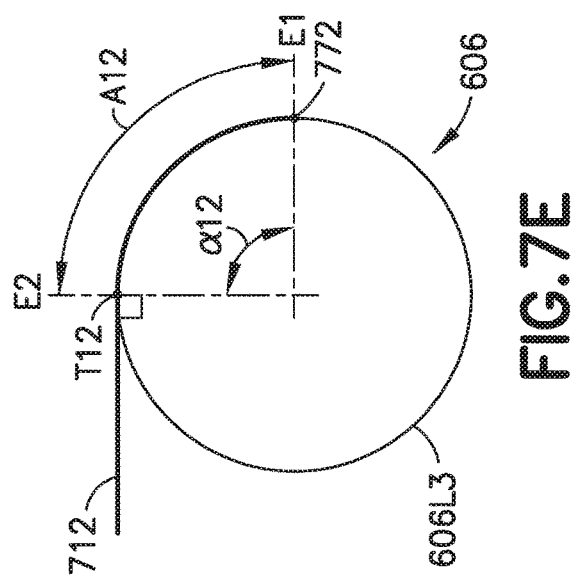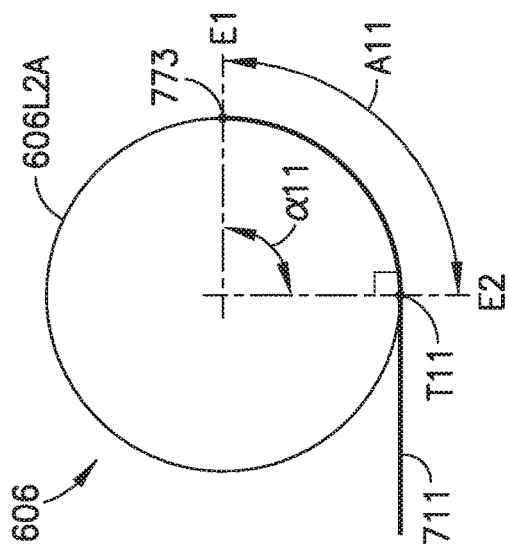

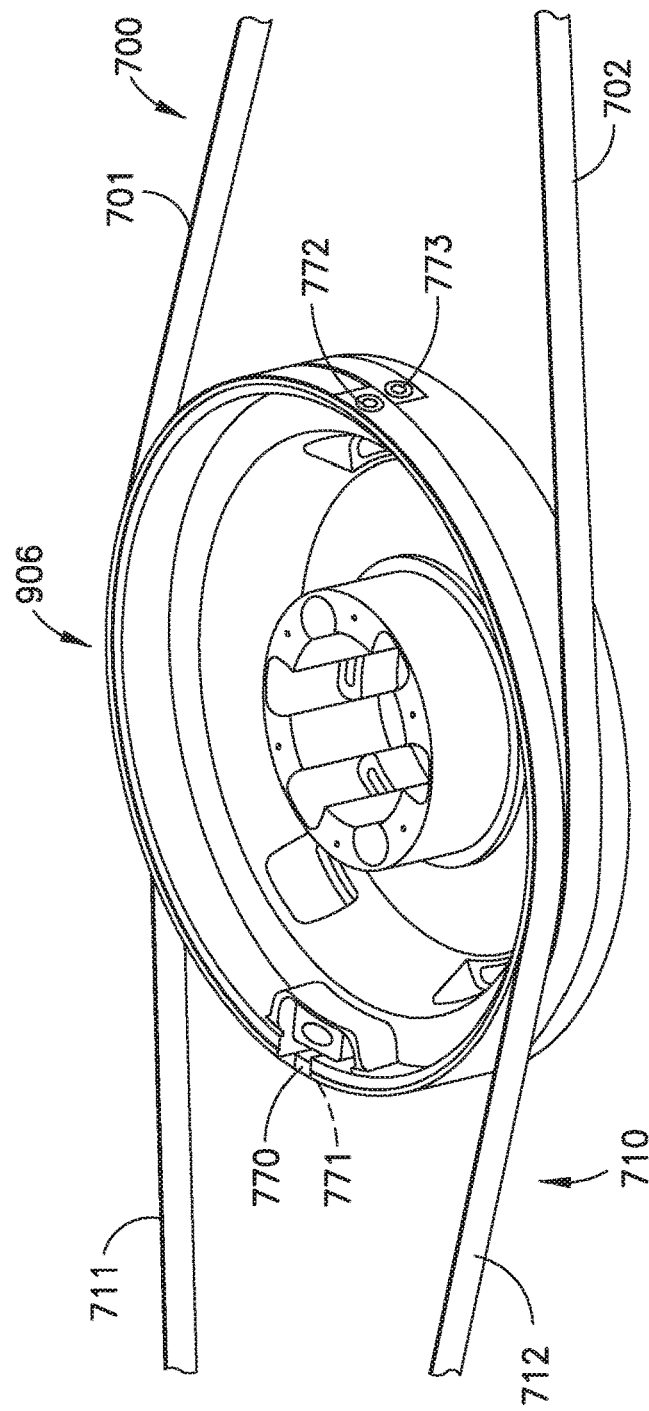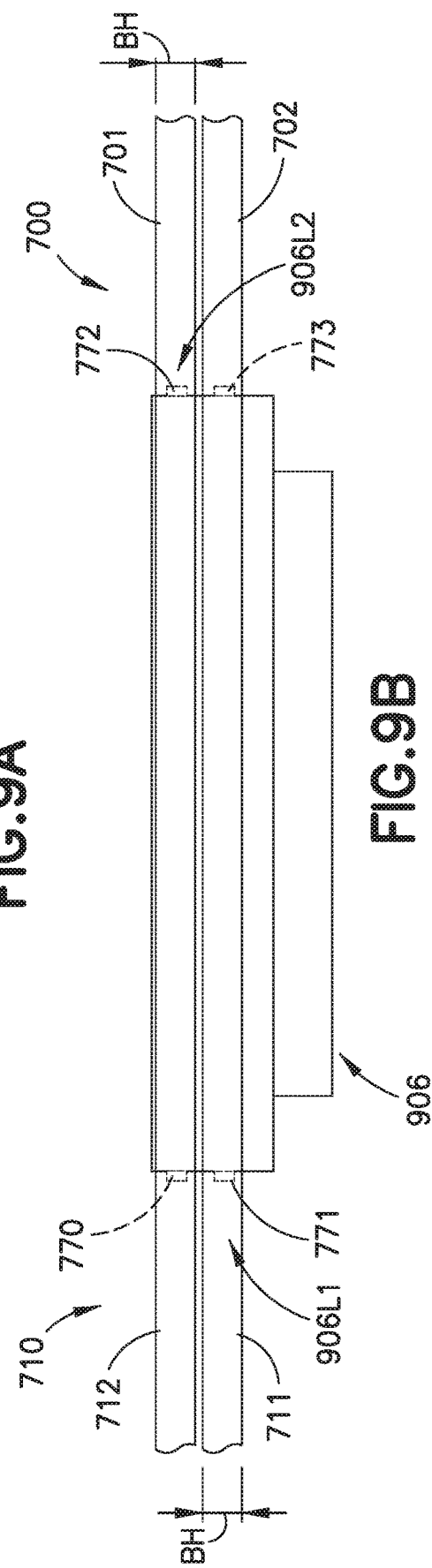
FIG.9A
FIG.9B

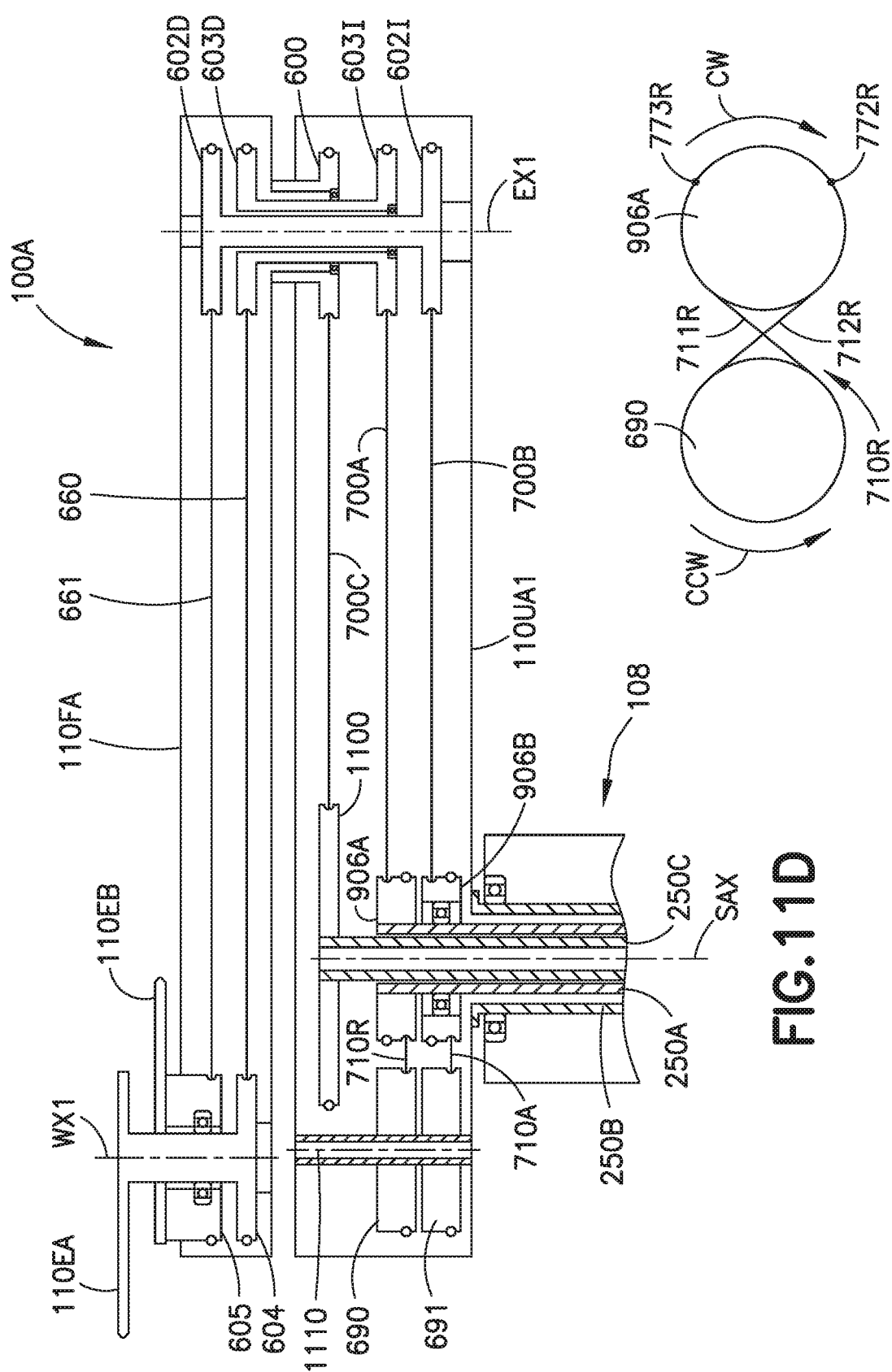

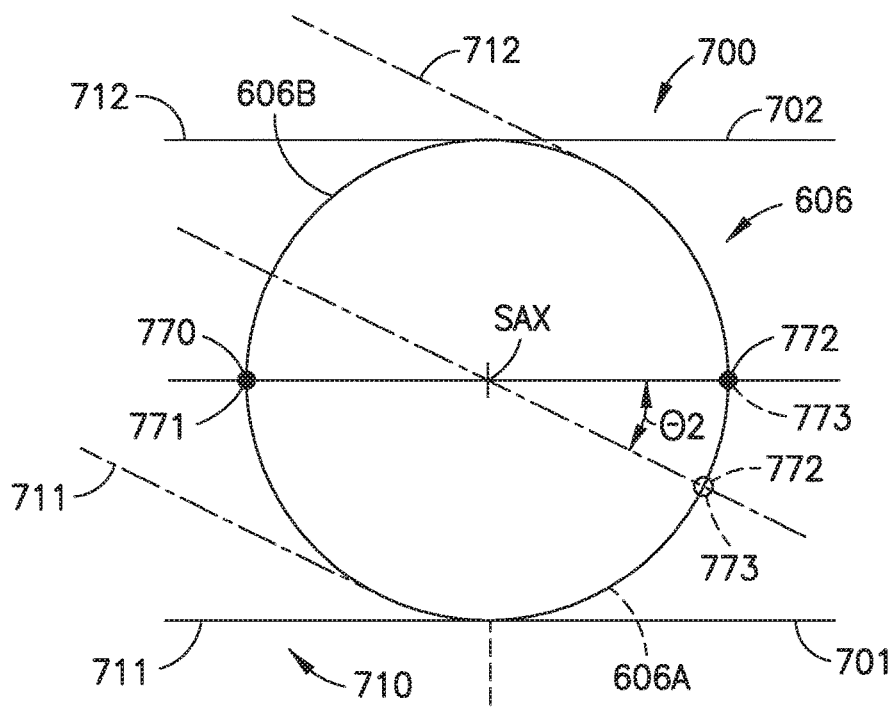
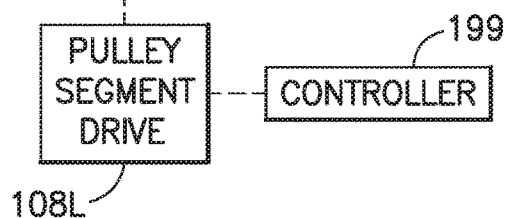
FIG.13A
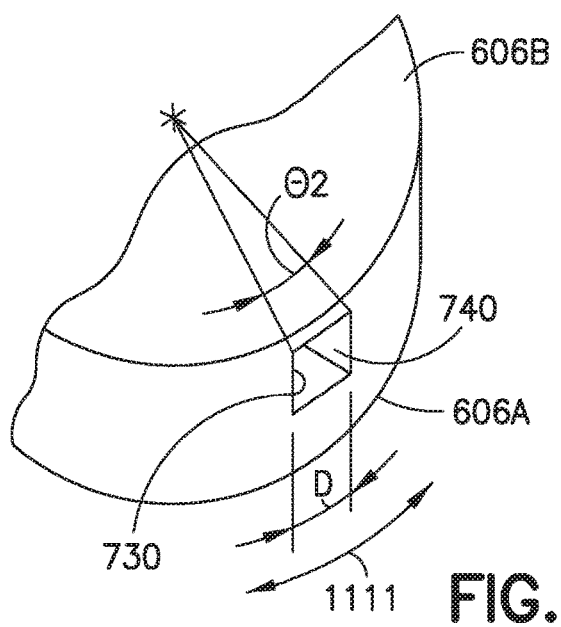
FIG.13B
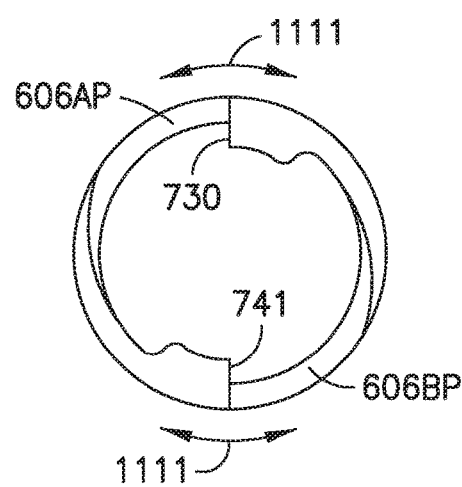
FIG.13C

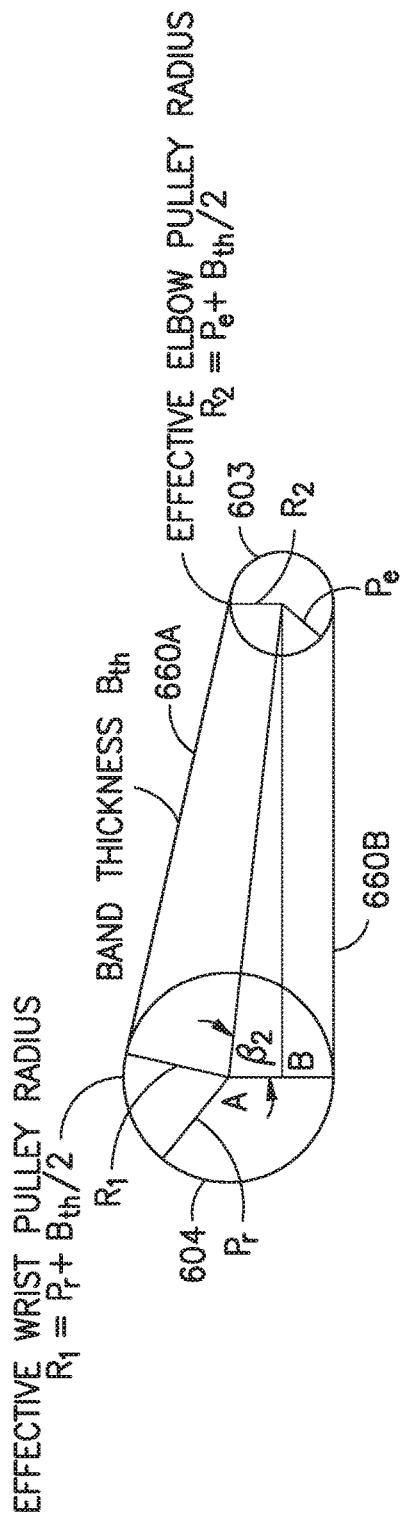

EFFECTIVE WRIST PULLEY RADIUS
$R_1 = P_r + B_{th}/2$

BAND THICKNESS $B_{th}$

EFFECTIVE ELBOW PULLEY RADIUS
$R_2 = P_e + B_{th}/2$

FIG. 14A

AC = PULLEY CENTER-TO-CENTER
BC = FREE LENGTH OF BAND
$AB = R_1 - R_2$
$AC^2 = AB^2 + BC^2$
$BC = \text{sqrt}(AC^2 - (R_1 - R_2)^2)$
$\text{cosine} \angle BAC = AB/AC$
$\angle BAC = \cos^{-1}((R_1 - R_2)/AC)$

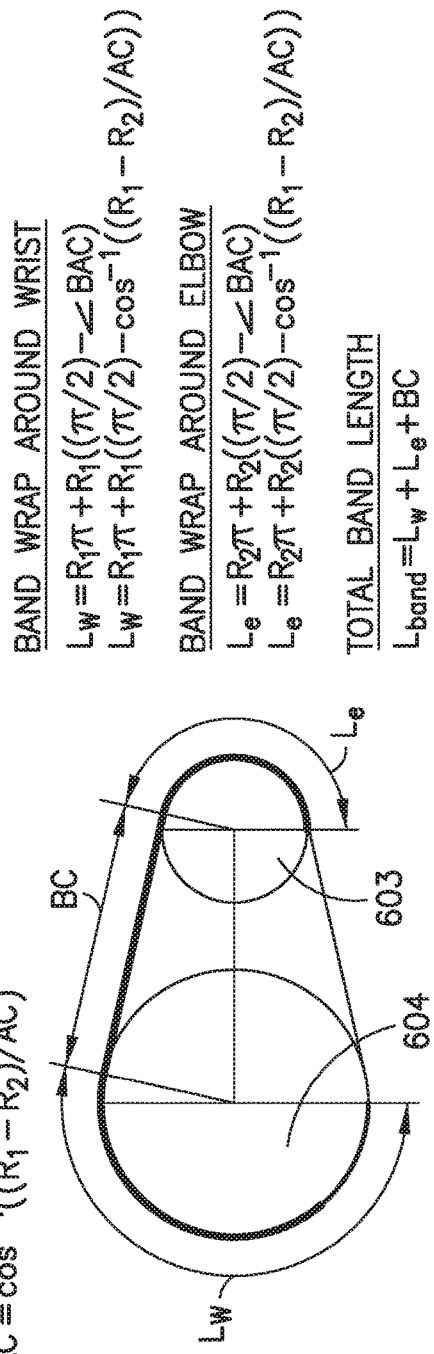

BAND WRAP AROUND WRIST
$L_w = R_1\pi + R_1((\pi/2) - \angle BAC)$
$L_w = R_1\pi + R_1((\pi/2) - \cos^{-1}((R_1 - R_2)/AC))$ BAND WRAP AROUND ELBOW
$L_e = R_2\pi + R_2((\pi/2) - \angle BAC)$
$L_e = R_2\pi + R_2((\pi/2) - \cos^{-1}((R_1 - R_2)/AC))$ TOTAL BAND LENGTH
$L_{band} = L_w + L_e + BC$

FIG. 14B

BAND WRAP AROUND WRIST
$$L_w = R_1\pi + R_1((\pi/2) - \angle BAC)$$
$$L_w = R_1\pi + R_1((\pi/2) - \cos^{-1}((R_1 - R_2)/AC))$$

BAND WRAP AROUND ELBOW
$$L_e = R_2\pi + R_2((\pi/2) - \angle DCE)$$
$$L_e = R_2\pi + R_2((\pi/2) - \cos^{-1}((R_3 - R_2)/CE))$$

BAND WRAP AROUND TENSIONER
$$L_1 = R_3(\angle DCE - \angle BAC)$$

TOTAL BAND LENGTH
$$L_{band} = L_w + L_1 + L_e + BC + DE$$

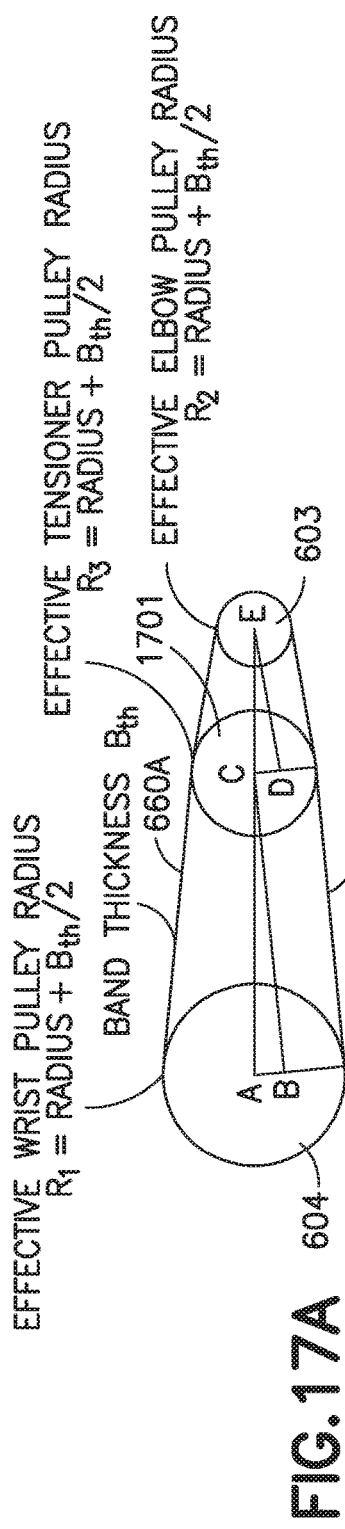

FIG. 17A

EFFECTIVE WRIST PULLEY RADIUS
$R_1$ = RADIUS + $B_{th}/2$

EFFECTIVE TENSIONER PULLEY RADIUS
$R_3$ = RADIUS + $B_{th}/2$

EFFECTIVE ELBOW PULLEY RADIUS
$R_2$ = RADIUS + $B_{th}/2$

BAND THICKNESS $B_{th}$

AE = AC + CE
AB = $R_1$ − $R_3$
CD = $R_3$ − $R_2$
$AC^2 = AB^2 + BC^2$
$CE^2 = CD^2 + DE^2$
BC = sqrt($AC^2$ − $(R_1 − R_3)^2$)
DE = sqrt($CE^2$ − $(R_3 − R_2)^2$)

AE = WRIST TO ELBOW PULLEY CENTER-TO-CENTER
AC = WRIST TO TENSIONER CENTER-TO-CENTER
CE = TENSIONER TO ELBOW CENTER-TO-CENTER
BC = FREE LENGTH OF BAND WRIST TO TENSIONER
DE = FREE LENGTH OF BAND TENSIONER TO ELBOW

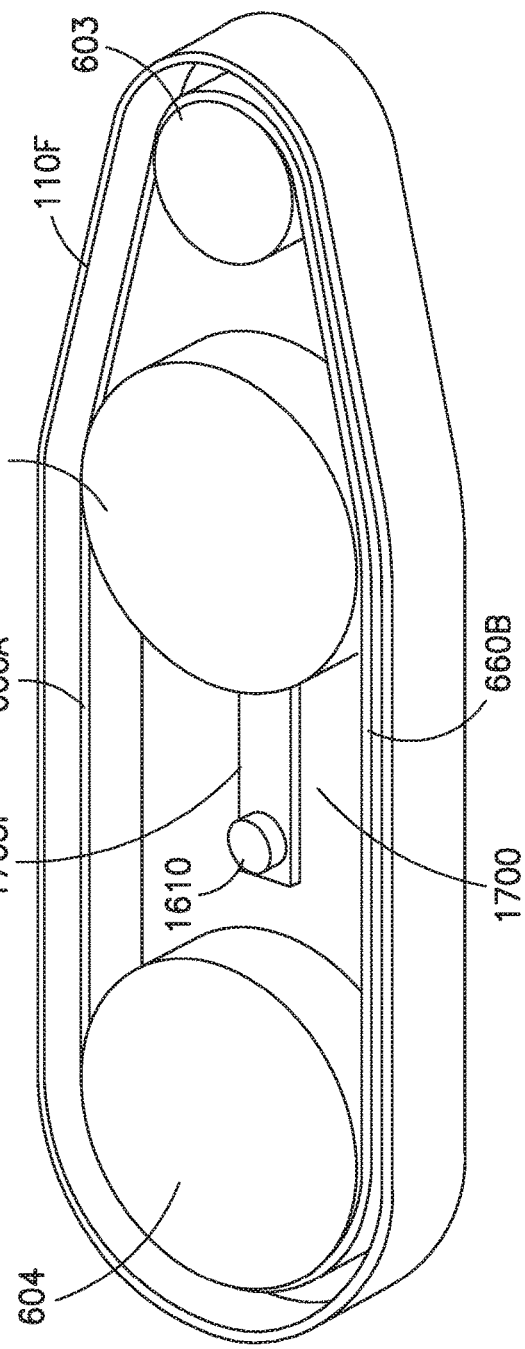

FIG. 17B

SUBSTRATE PROCESSING APPARATUS

CROSS-REFERENCE TO RELATED APPLICATIONS

This application is a non-provisional of and claims the benefit of U.S. provisional patent application No. 62/361,325, filed on Jul. 12, 2016, the disclosure of which is incorporated herein by reference in its entirety.

BACKGROUND

1. Field

The exemplary embodiments generally relate to substrate processing tools, more particularly, to substrate transport apparatus.

2. Brief Description of Related Developments

In semiconductor processing dual SCARA (selective compliant articulated robot arm) arm robot may be used to transfer wafers to and from a semiconductor process module. The dual SCARA arm robot generally allows for a fast swapping of substrates from and to the process module where a fast swap may be referred to as the removal of one substrate from the process module and the placement another different substrate to the same process module in rapid succession without rotating the dual SCARA arm robot as a unit about the shoulder axis of the dual SCARA arm robot and substantially without retracting the arm to a battery position or a fully retracted position.

Generally each arm of the dual SCARA arm robot includes an upper arm rotatable about a shoulder axis, a forearm rotatably coupled to the upper am about an elbow axis and an end effector or substrate holder coupled to the forearm about a wrist axis. Generally each forearm is independently driven by a respective drive axis (e.g. degree of freedom) of a drive system while rotation of both the SCARA arms as a unit occurs with yet another independent drive axis (e.g. degree of freedom) of the drive section. Generally, referring to FIGS. 8A and 8B, each drive axis for driving the forearms includes a respective drive pulley 800, 810 (e.g. one pulley for each forearm) where each pulley 800, 810 drives a respective transmission loop 803, 813. Each transmission loop 803, 813 is comprised of two bands 801, 802, 811, 812 that are wrapped around the respective pulley 800, 810 so as to cover an arc that spans about 180 degrees relative to an axis of rotation of the pulleys 800, 810. Here, the bands 801, 802, 811, 812 must be stacked one above the other on each pulley 800, 810 thereby defining a height PH of each pulley as being at least, twice the height BH of a single band 801, 802, 811, 812. As such, in the case of a conventional dual SCARA arm robot the height of the stacked forearm pulleys 800, 810 would be at least four times the height BH of a single band 801, 802, 811, 812. Likewise, if the forearm drive pulleys 800, 810 were located side by side (e.g. so that the shoulder axes of the dual SCARA arms are located side by side) the heiqht of the side by side pulley arrangement would be at least two times the height BH of a single band 801, 802, 811, 812.

The substrate transport robots generally operate within a transport chamber where the transport chamber internal height accommodates the height of, for example, the dual SCARA arm of the transport robot, the Z-travel range of the arm in addition to the required operational clearance between the arms and the walls of the transport chamber.

It would be advantageous to have a reduced heiqht transport arm pulley system so as; to decrease the internal height of the transport chamber thereby decreasing the internal volume of the transport chamber. Decreasing the internal volume of the transfer chamber may increase throughput of a semiconductor processing system as the time it takes to pump down the chamber to vacuum and/or evacuate the chamber to atmospheric pressure is decreased. In addition, decreasing the overall height of the transport chamber decreases the cost of the transport chamber.

Further, current temperature specifications for a substrate transport robot ranges from about room temperature to about 100° C. As the temperature rises, the difference in the coefficients of thermal expansion between at least the transport-robot arm links and the bands 801, 802, 811, 812 induces a difference in the distance between pulleys and the length of the bands 801, 802, 811, 812. This difference may result in increased or decreased tension in the bands 801, 802, 811, 812 and causes a shift in the natural frequency of the bands and may also change the stiffness of the robot arms. Generally band tension is maintained through the use of spring and pulley tensioning mechanisms.

It would be advantageous to have a passive band tensioner that operates using the mechanical properties of materials to provide a passively maintained (e.g. without spring forces) constant tension in the bands. It would also be advantageous to passively compensate for the thermal expansion of the arms so that a constant tension is maintained in the band segments of the transport apparatus transmission loops.

BRIEF DESCRIPTION OF THE DRAWINGS

The foregoing aspects and other features of the disclosed embodiment are explained in the following description, taken in connection with the accompanying drawings, wherein:

FIG. 4 is a schematic illustration of a substrate transport apparatus in accordance with one or more aspects of the disclosed embodiment;

FIGS. 6A and 6B are schematic illustrations of portions of a substrate transport apparatus in accordance with one or more aspects of the disclosed embodiment;

FIGS. 7A-7H are schematic illustrations of portions of a substrate transport apparatus in accordance with one or more aspects of the disclosed embodiment;

FIGS. 9A and 9B are schematic illustrations of portions of a substrate transport apparatus in accordance with one or more aspects of the disclosed embodiment;

FIGS. 11A-11E are schematic illustrations of a substrate transport apparatus in accordance with one or more aspects of the disclosed embodiment;

FIGS. 13A-13C are schematic illustrations of portions of a substrate transport apparatus in accordance with one or more aspects of the disclosed embodiment;

FIGS. 14A-14B are schematic illustrations of portions a substrate transport apparatus in accordance with one or more aspects of the disclosed embodiment;

FIGS. 17A and 17B are schematic illustrations of portions of a substrate transport in accordance with one or more aspects of the disclosed embodiment.

DETAILED DESCRIPTION

Figure 1:
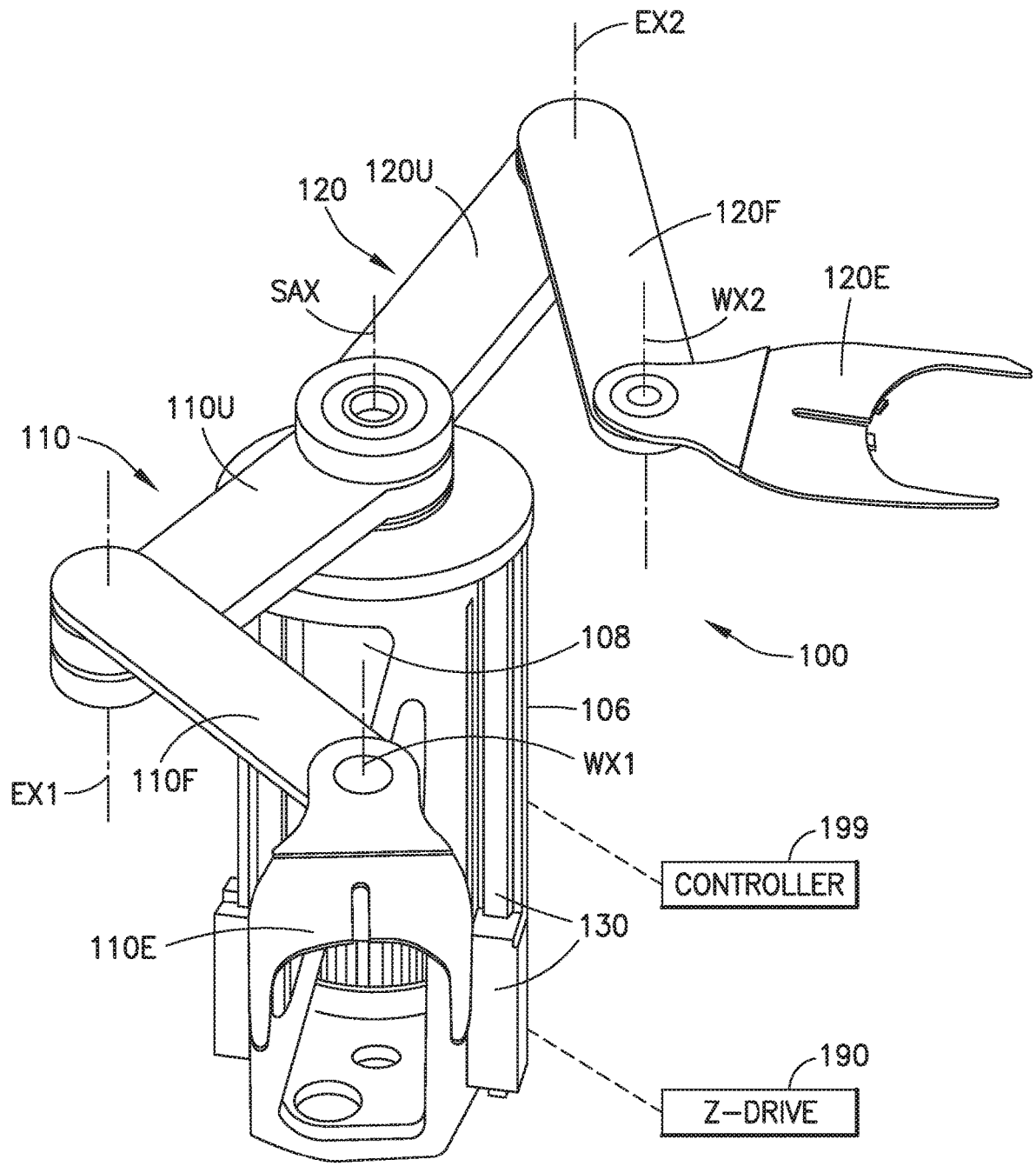
FIG. 1 is a schematic illustration of a substrate transport apparatus in accordance with one or more aspects of the disclosed embodiment.

FIG. 1 illustrates a dual SCARA arm processing apparatus 100 (also referred to herein as the "transport apparatus 100") in accordance with aspects of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

In one aspect the transport apparatus 100 includes a carriage or frame 106, at least two SCARA arms and a drive section 108 mounted to the frame and coupled to the first and second SCARA arms 110, 120. Any suitable controller 199 is connected to the drive section 108 and includes any suitable program code for effecting operation of the transport apparatus 100 as described herein. In one aspect the at least two SCARA arms include a first SCARA arm 110 connected to the frame 106 and a second SCARA arm 120 connected to the frame 106. The first SCARA arm 110 includes an upper arm link 110U that is rotatably connected at a proximate end of the upper arm link 110U to the frame 106 about a shoulder axis of rotation SAX, a forearm link 110F that is rotatably connected at a proximate end of the forearm link 110F to a distal end of the upper arm link 110U about an elbow axis of rotation EX1, and an end effector 110E that is rotatably coupled to a distal end of the forearm link 110E about a wrist axis of rotation WX1. The second SCARA arm 120 includes an upper arm link 120U that is rotatably connected at a proximate end of the upper arm link 120U to the frame 106 about the shoulder axis of rotation SAX, a forearm link 120F that is rotatably connected at a proximate end of the forearm link 120F to a distal end of the upper arm link 120U about an elbow axis of rotation EX2, and an end effector 120E that is rotatably coupled to a distal end of the forearm link 120F about a wrist axis of rotation WX2. While only a single end effector 110E, 120E is illustrated as being coupled to each wrist axis of rotation WX1, WX2, in other aspects any suitable number of end effectors may be coupled to one or more of the wrist axes WK1, WX2 to effect batch transfers of substrates or fast swapping of substrates with a single SCARA arm 110, 120 of the transport apparatus 100. In this aspect, the shoulder axis of rotation SAX is common to both the first and second SCARA arms 110, 120 while in other aspects, the first and second SCARA arms 110, 120 may have respective shoulder axes of rotation that are arranged side by side.

Figure 2:
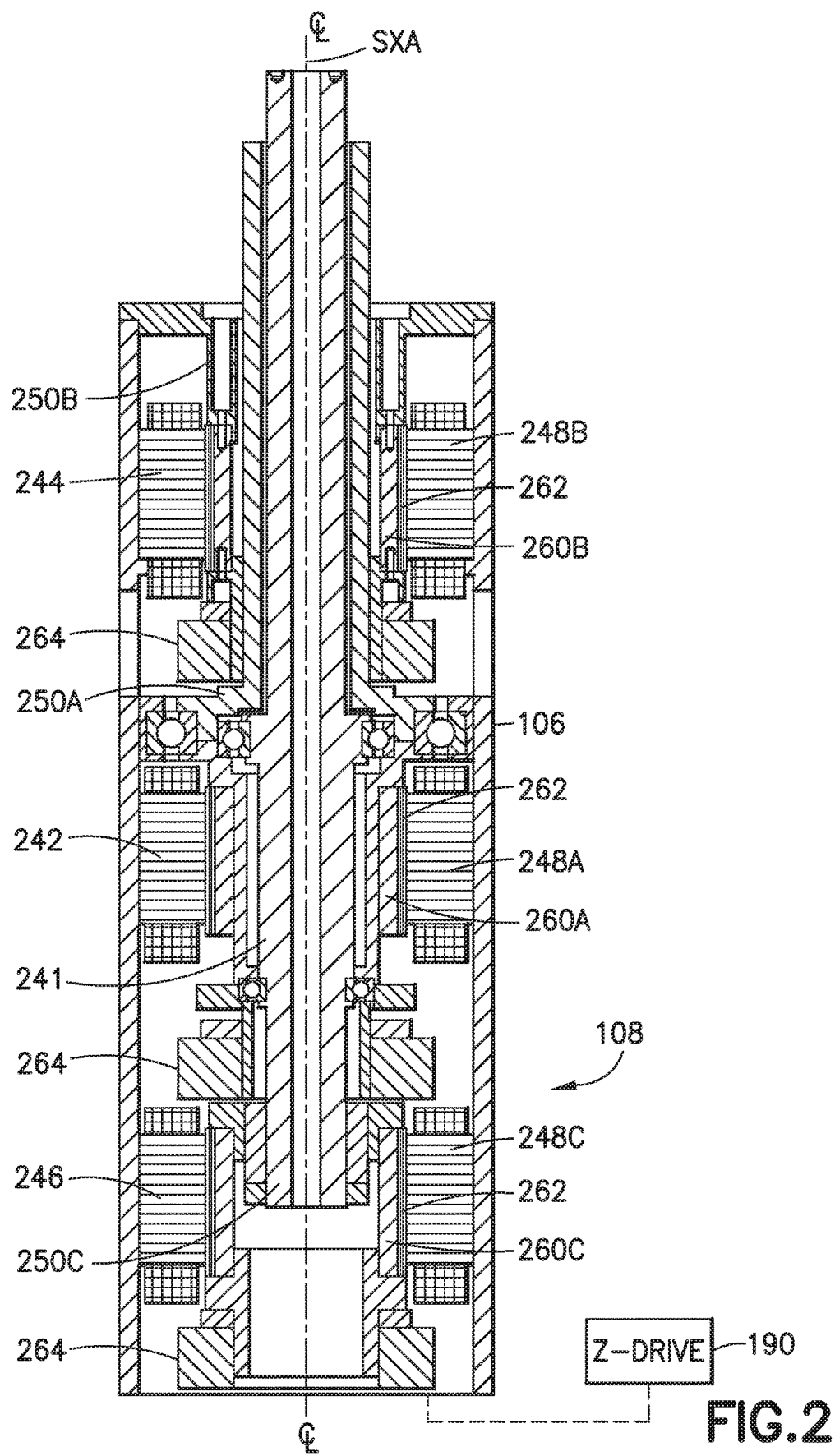
FIG. 2 is a schematic illustration of a portion of a substrate transport apparatus in accordance with one or more aspects of the disclosed embodiment.
Figure 3A:
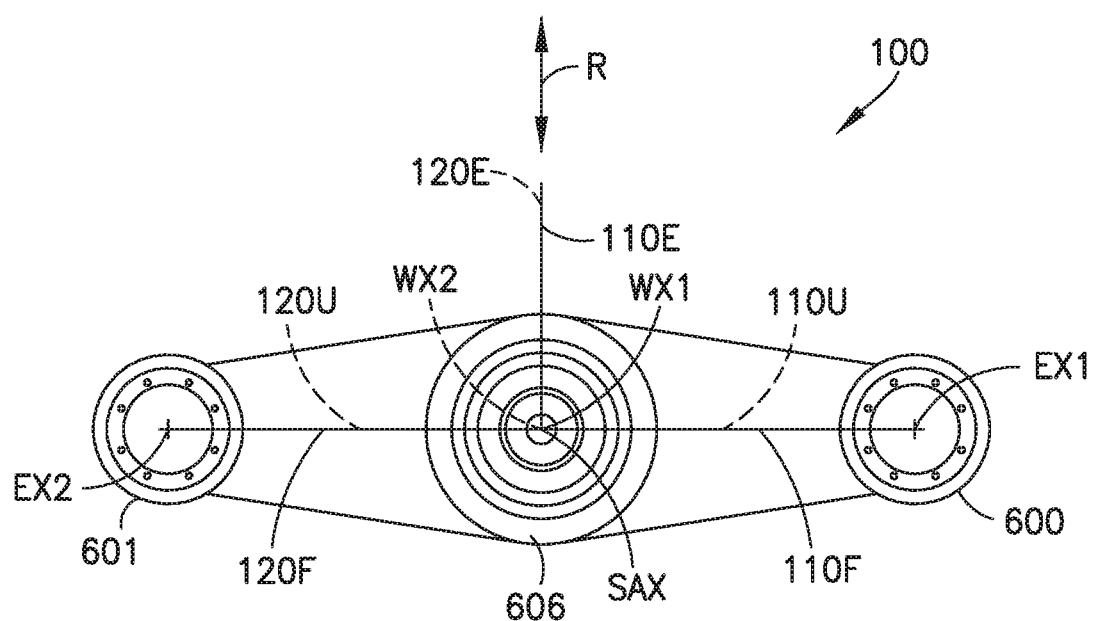
FIGS. 3A and 3B are schematic illustrations of a portion of the substrate transport apparatus of FIG. 1 in accordance with one or more aspects of the disclosed embodiment.
Figure 3B:
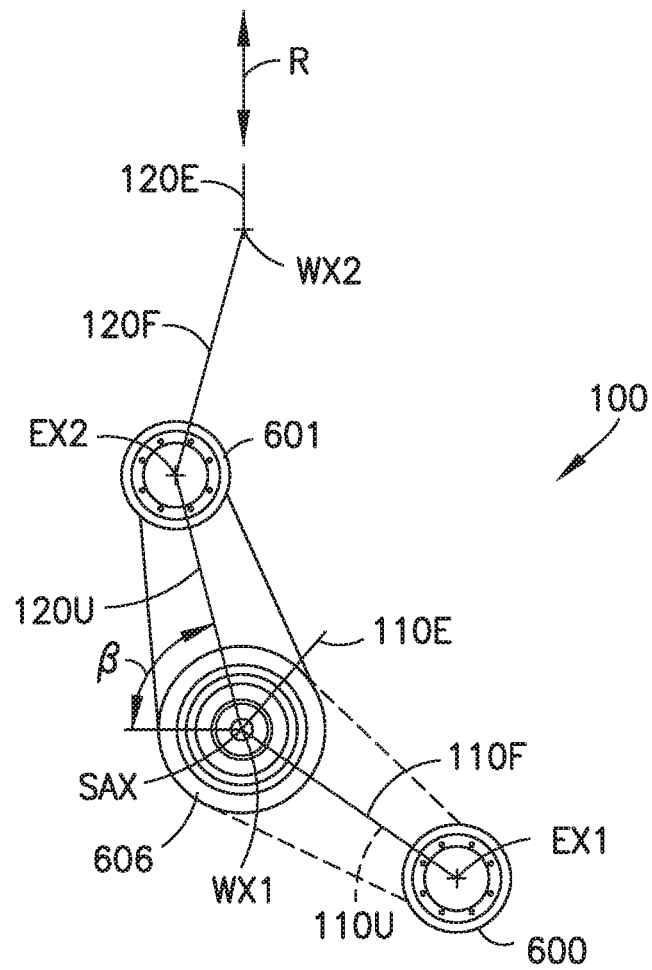
Figure 5A:
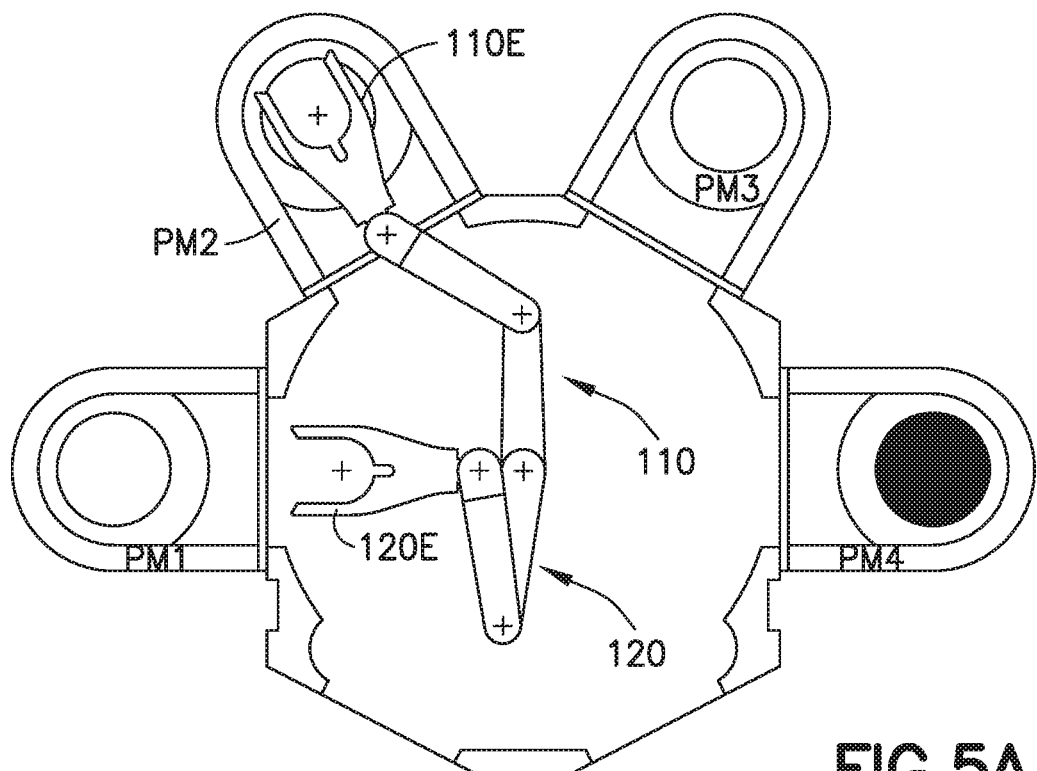
FIGS. 5A-5G are schematic illustrations of a substrate transport apparatus in accordance with one or more aspects of the disclosed embodiment.
Figure 5B:
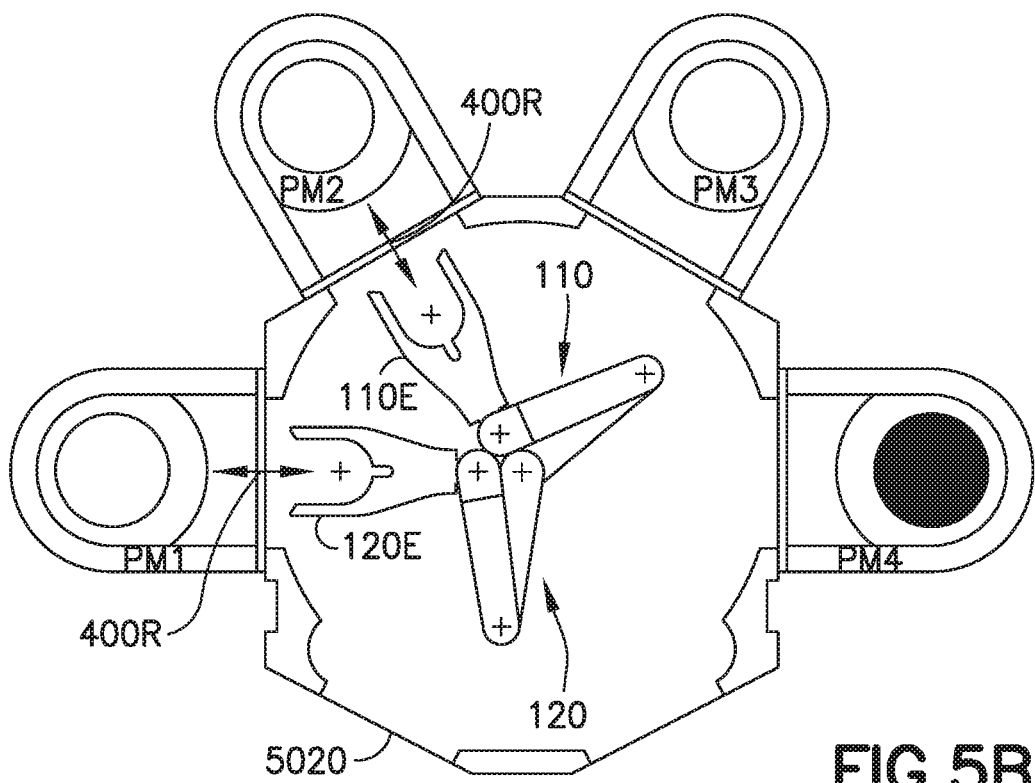
Figure 5C:
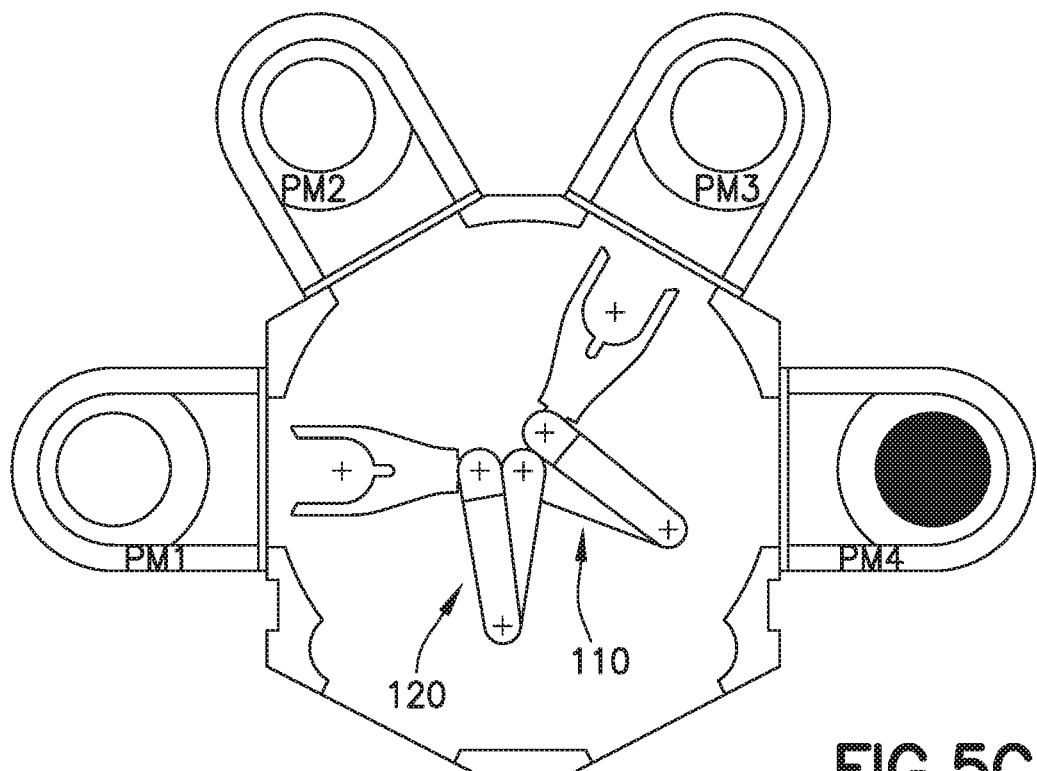
Figure 5D:
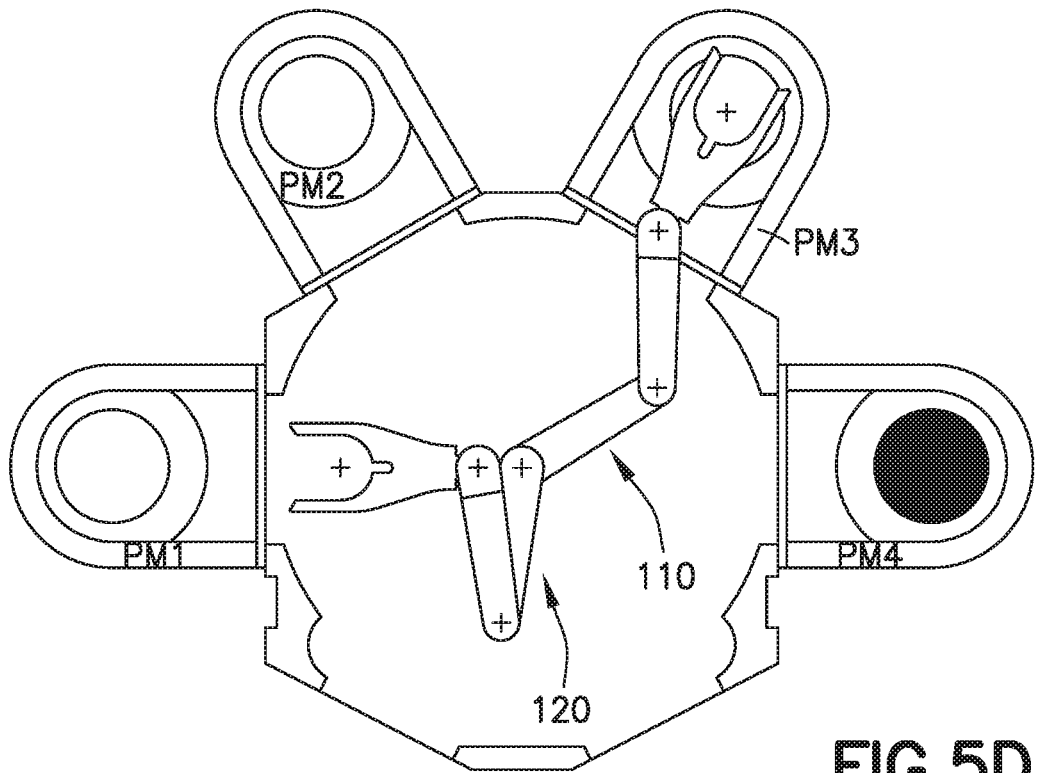
Figure 5E:
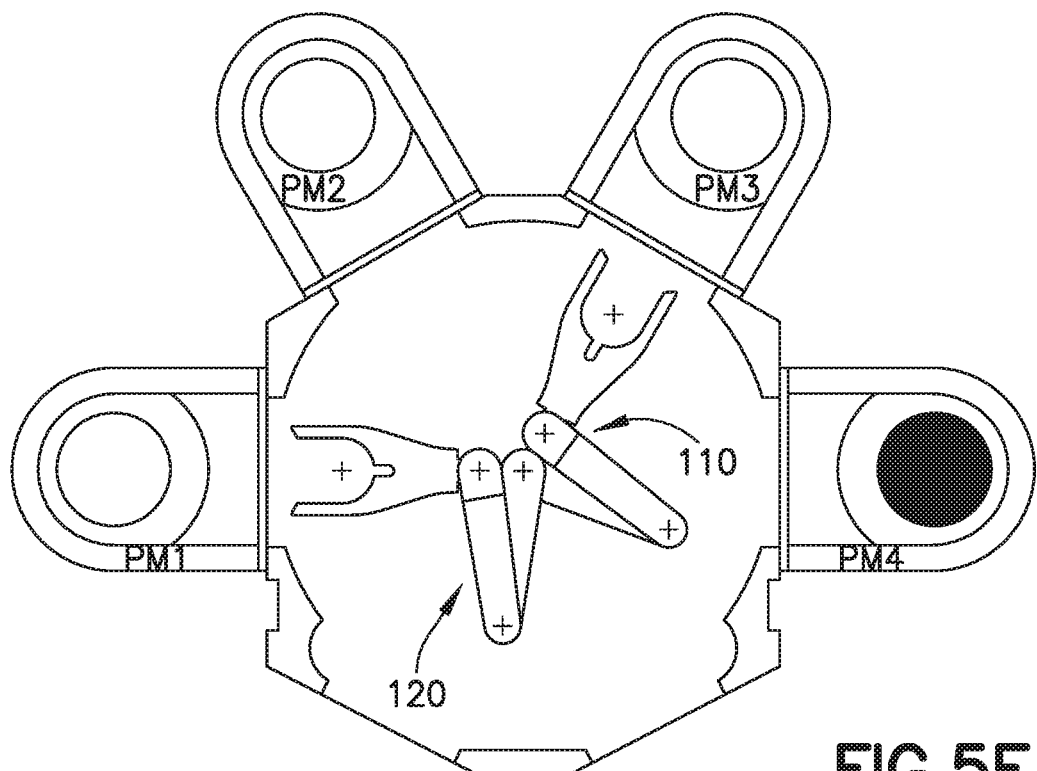
Figure 5F:
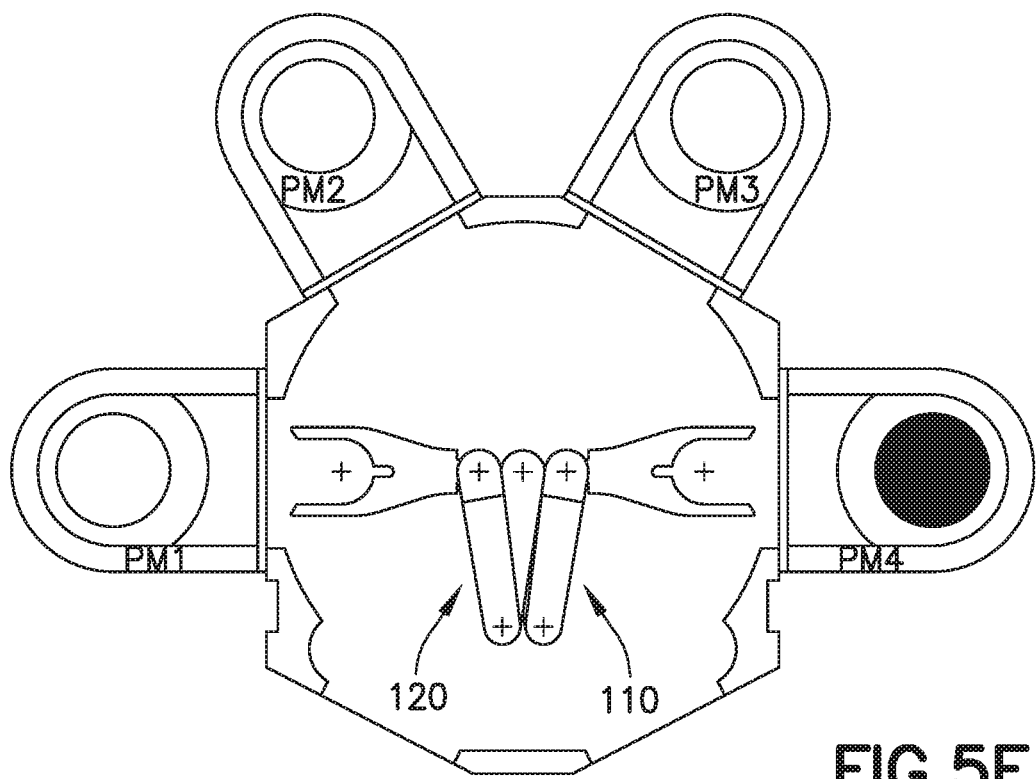
Figure 5G:
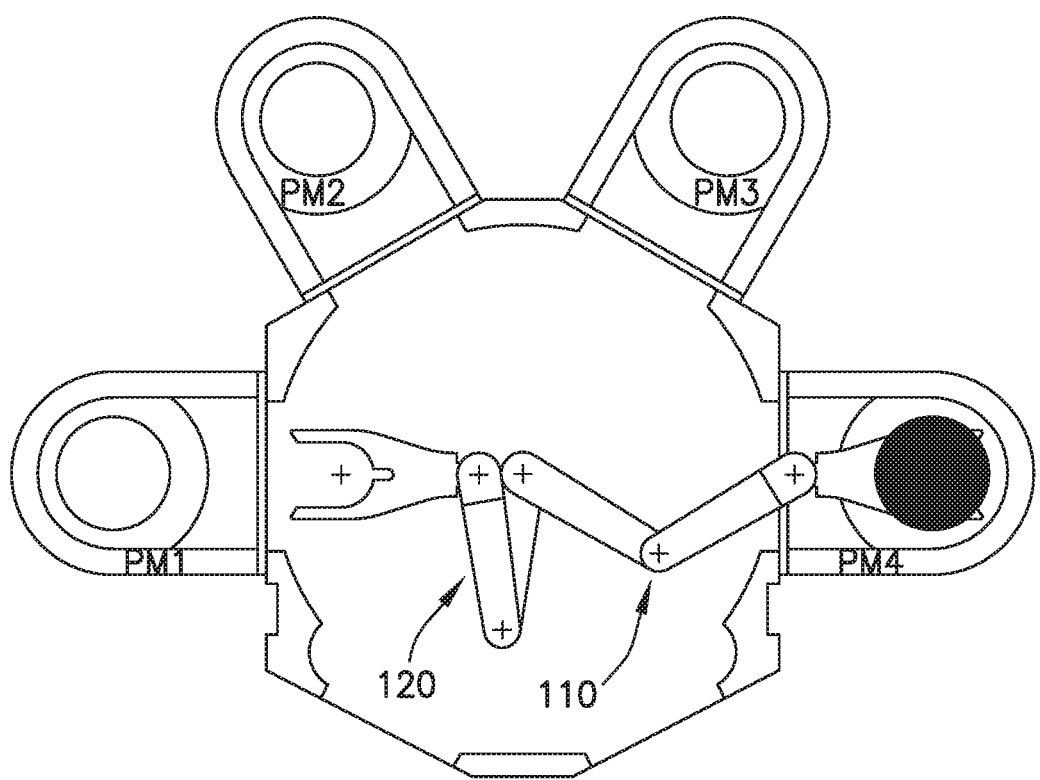

Referring also to FIGS. 2, 3A and 3B, in one aspect, the drive section 108 is mounted to the frame 106 in any suitable manner. In one aspect the drive section 108 is a three axis (e.g. three degree of freedom) drive section while in other aspects the drive section may include any suitable number of drive axes. In one aspect, the drive section 108 generally comprises a drive shaft assembly 241 and three motors 242, 244, 246. In this aspect, the drive shaft assembly 241 has three drive shafts 250A, 250B, 250C. As may be realized the drive system may not be limited to three motors and three drive shafts. The first motor 242 comprises a stator 248A and a rotor 260A connected to the middle shaft 250A. The second motor 244 comprises a stator 248B and a rotor 260B connected to the outer shaft 250B. The third motor 246 comprises a stator 248C and rotor 260C connected to the inner shaft 250C. The three stators 248A, 248B, 248C are stationarily attached to the frame 106 at different vertical heights or locations along the frame 106 (it is noted that a three axis drive system including radially nested motors such as those described in U.S. patent application Ser. No. 13/293,717 filed on Nov. 10, 2011 and U.S. Pat. No. 8,008,884 issued on Aug. 30, 2011, the disclosures of which are incorporated herein by reference in their entireties, may also be used to drive the transport apparatus 100). For illustrative purposes only, the first stator 248A is the middle stator, the second stator 248B is the top stator and the third stator 248C is the bottom stator. Each stator generally comprises an electromagnetic coil. The three drive shafts 250A, 250B, and 250C are arranged as coaxial drive shafts. The three rotors 260A, 260B, 260C are preferably comprised of permanent magnets, but may alternatively comprise a magnetic induction rotor that does not have permanent magnets. Sleeves or thin can seals 262 are preferably located between the rotors 260A, 260B, 260C and the respective stators 248A, 248B, 248C so seal the stators 248A, 248B, 248C from an operational environment of the SCARA arms 110, 120 and to allow the transport apparatus 100 to be useable in a vacuum environment with the drive shaft assembly 241 being located in a vacuum environment and the stators 248A, 248B, 248C being located outside of the vacuum environment. However, the sleeves 262 need not be provided if the transport apparatus 100 is only intended for use in an atmospheric environment.

The third shaft 250C is the inner shaft an a extends from the bottom stator 248C. The inner shaft 250C has the third rotor 260C aligned with the bottom stator 248C. The middle shaft 250A extends upward from the middle stator 248A. The middle shaft has the first rotor 260A aligned with the first stator 248A. The outer shaft. 250B extends upward from the top stator 248B. The outer shaft has the second rotor 260B aligned with the upper stator 248B. Various bearings are provided about the shafts 250A-250C and the frame 106 to allow each shaft to be independently rotatable relative to each other and the frame 106. In one aspect, each shaft 250A-250C may be provided with a position sensor 264. The position sensors 264 are used to signal the controller 199 of the rotational position of the shafts 250A-250C relative to each other and/or relative to the frame 106. Any suitable sensor could be used, such as optical or induction. The drive section 108 may also include one or more suitable Z-axis drives 190 for moving the upper arm links 110U, 120U, the forearm links 110F, 120F and end effectors 110E, 120E of the transport apparatus 100 in a direction substantially parallel with (e.g. along) the shoulder axis of rotation SAX as a unit. In another aspect one or more revolute joints (such as the wrist or elbow axes) of the transport apparatus 100 may include a Z-axis drive to, for example, move the end effector(s) of each arm in the Z-direction independently of each other.

In one aspect, the outer shaft 250B is coupled to upper arm link 110U so that the outer shaft 250B and the upper arm link 110U rotate as a unit about the shoulder axis of rotation SAX. The middle shaft 250A is coupled to the upper arm link 120U so that the middle shaft 250A and the upper arm link 120U rotate as a unit about the shoulder axis of rotation SAX. In other aspects, the outer shaft 250B may be coupled to upper arm link 120U and the middle shaft 250A may be coupled to upper arm link 110U. The inner shaft 120C is connected to each of the forearm links 110F, 120F so as to commonly drive each forearm link 110F, 120F.

In one aspect, as illustrated in FIGS. 1, 3A and 3B the upper arm links 110U, 120U and forearm links 110F, 120F may have substantially equal lengths while in other aspects, the upper arm links 110U, 120U and forearm links 110F, 120F may have unequal lengths. In another aspect, the end effectors 110E, 120E may have a predetermined length so that the upper arm links 110U, 120U and the forearm links 110F, 120F are swept in a direction opposite the direction of extension 400 of the end effector 110E, 120E (e.g. the wrist axes of rotation WX1, WX2 and the elbow axes of rotation EX1, EX2 are located behind the shoulder axis of rotation SAX) when the first and second SCARA arms 110, 120 are in a retracted configuration as illustrated in FIG. 4. In the aspects, illustrated in FIGS. 1, 3A, 3B and 4 the end effectors 110E, 120E are stacked one above the other over the shoulder axis SAX in different planes so that one end effector 110E, 120E passes over the other end effector 110E, 120E and each SCARA arm 110, 120 has independent extension and retraction along an extension axis R (see FIGS. 3A and 3B) that is common to both SCARA arms 110, 120 and that passes over the shoulder axis of rotation SAX. In other aspects, referring also to FIGS. 5A-5G, the end effectors 110E, 120E may be located on the same plane (e.g. do not pass one over the other) where an axis of extension and retraction 400R of each of the first and second SCARA arms 110, 120 are angled relative to one another where the angle between the axes of extension and retraction 400R corresponds to an angle between process modules PM1-PM4 coupled to the transfer chamber 5020 in which the SCARA arms 110, 120 are located.

Figure 6B:
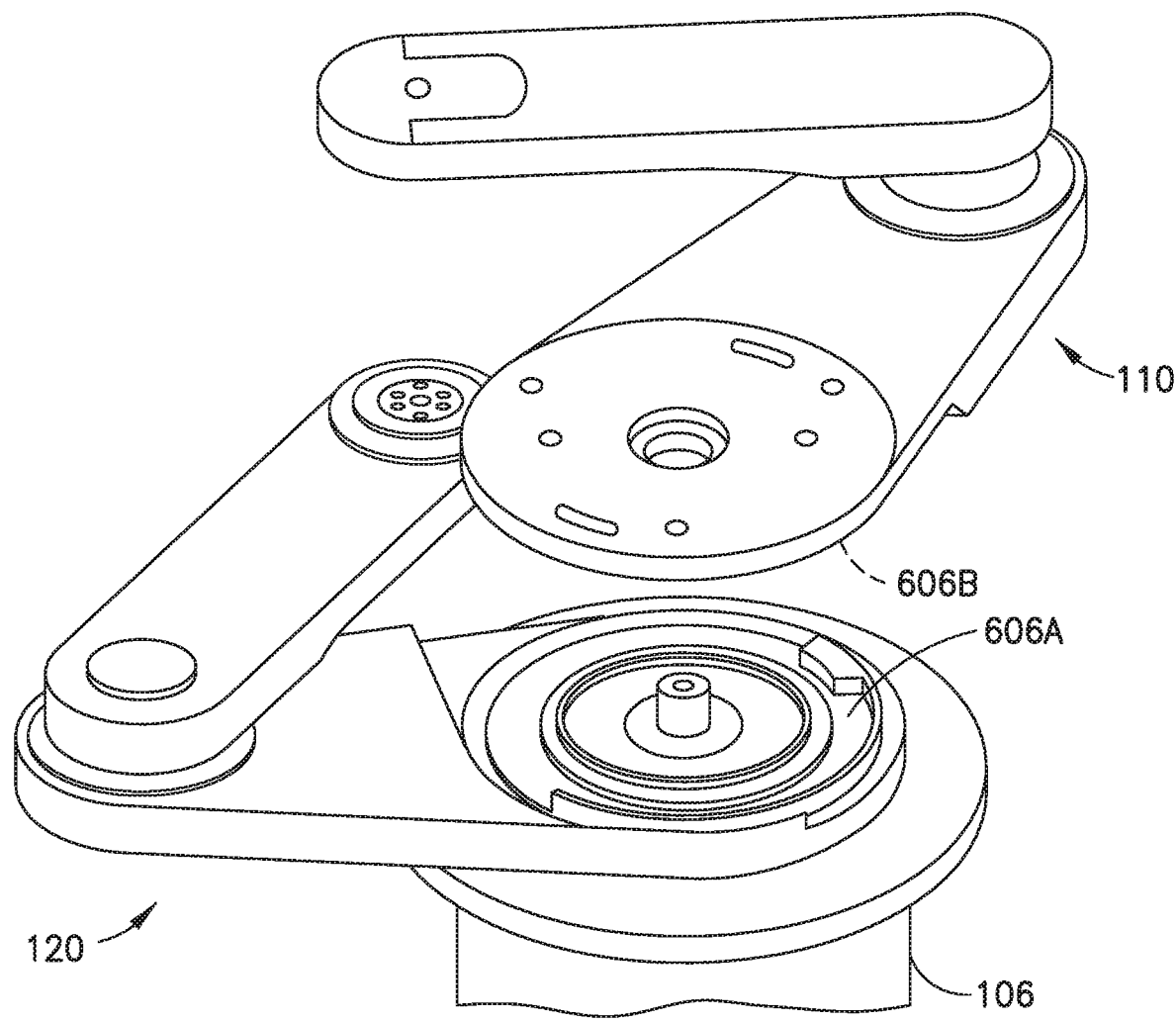
Figure 7A:
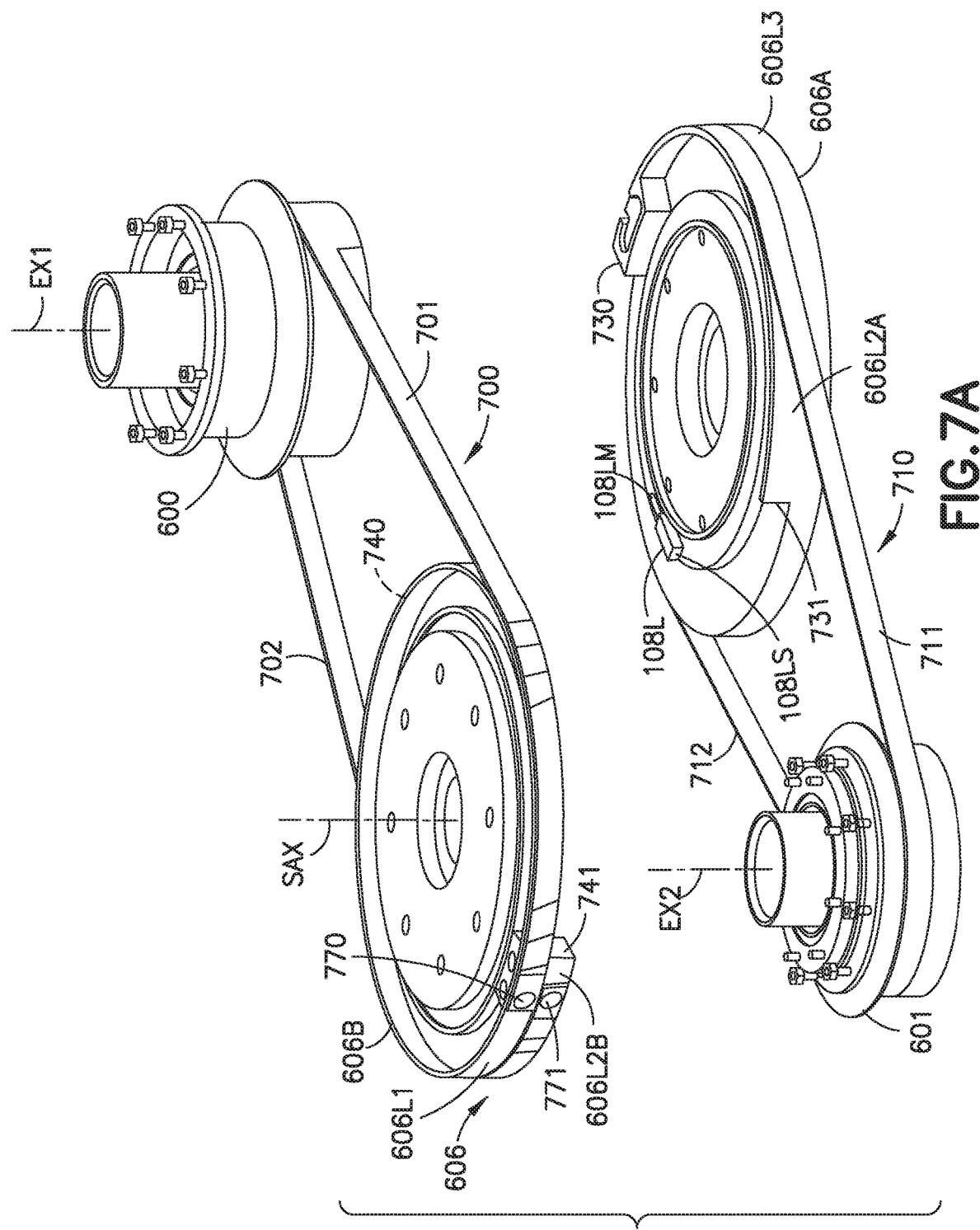
Figure 7B:
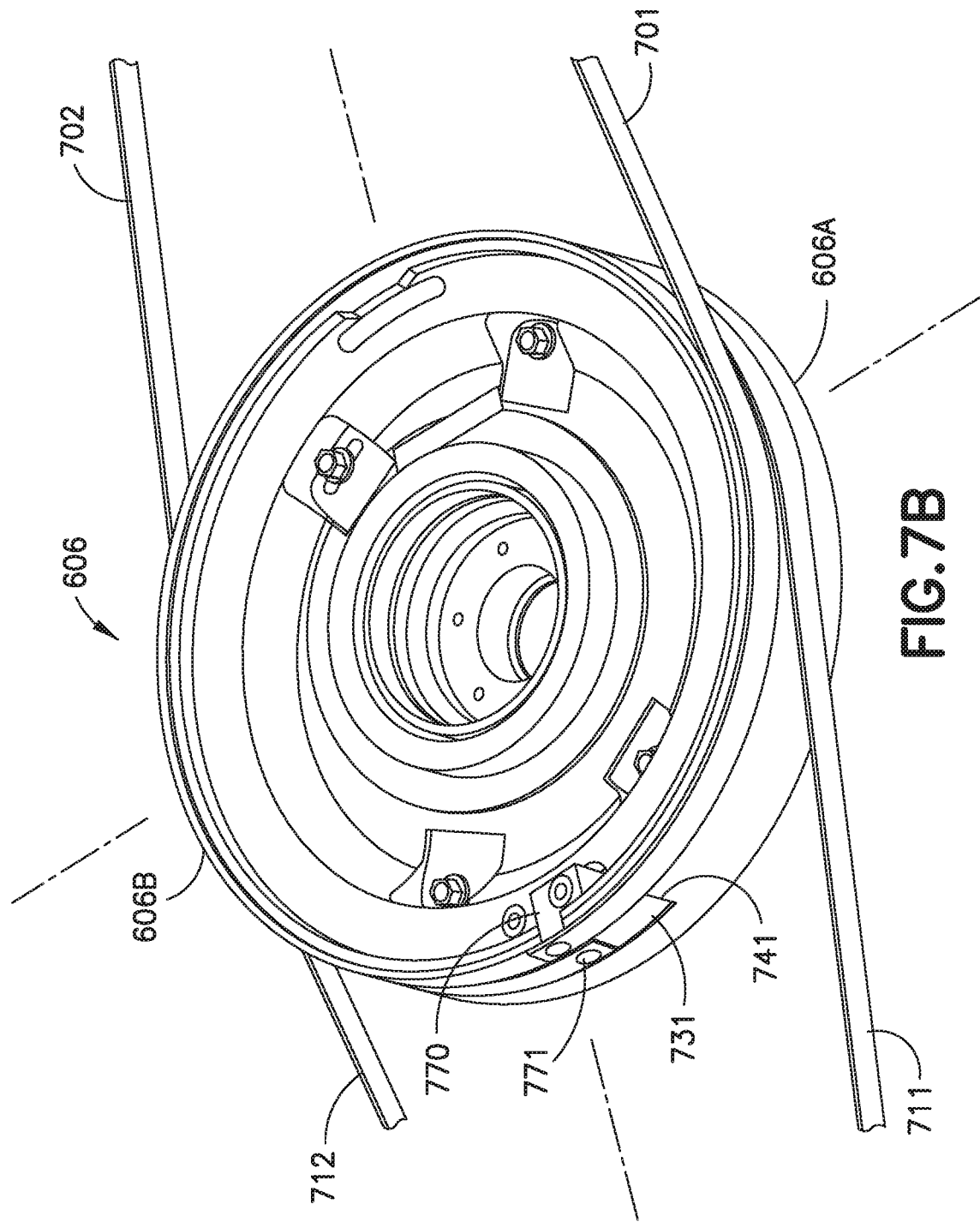
Figure 7C:
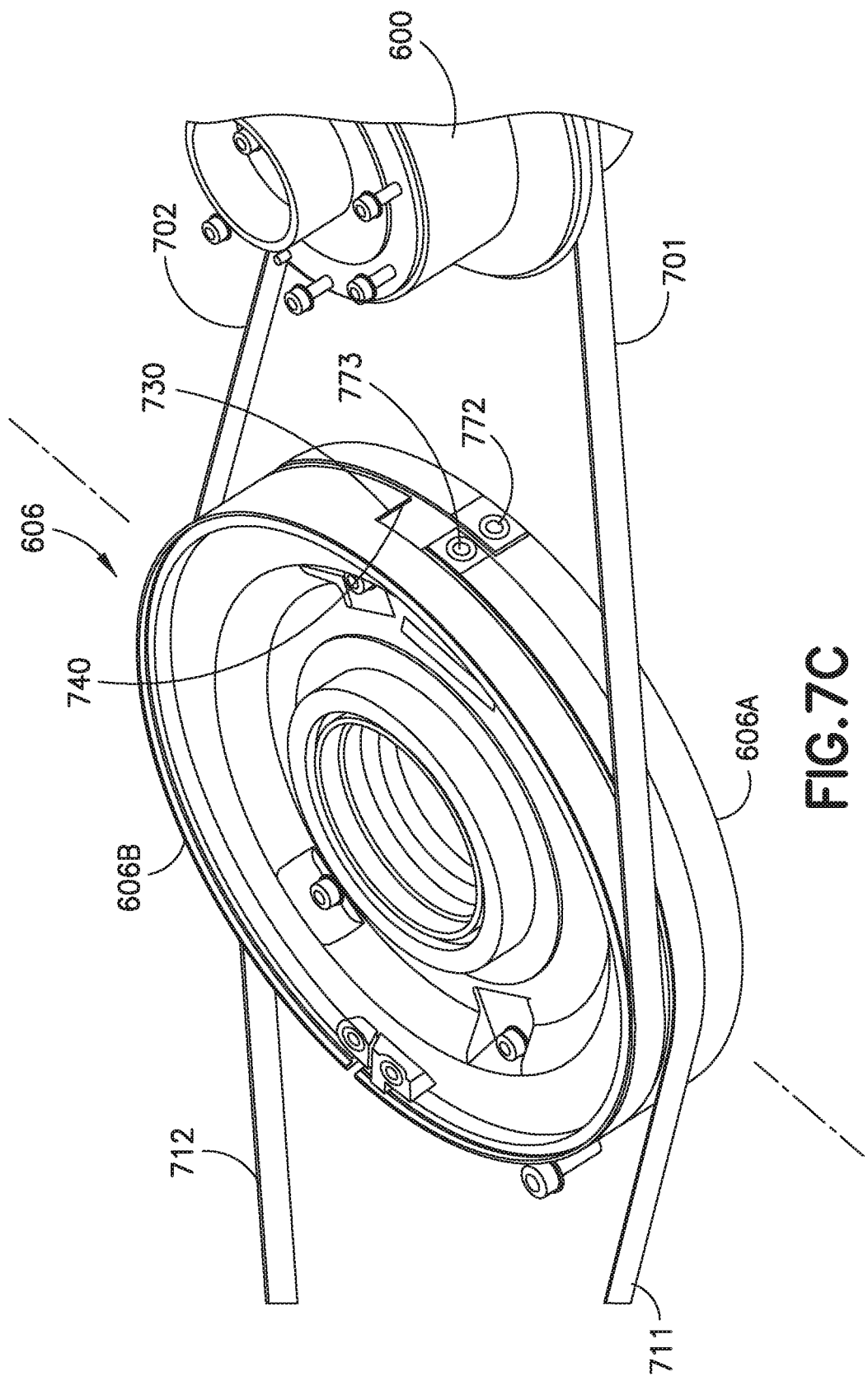
Figure 7D:
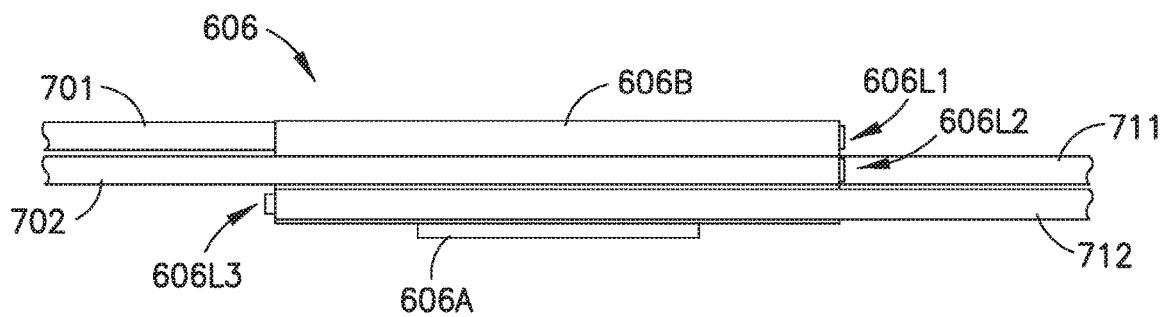
Figure 8A:
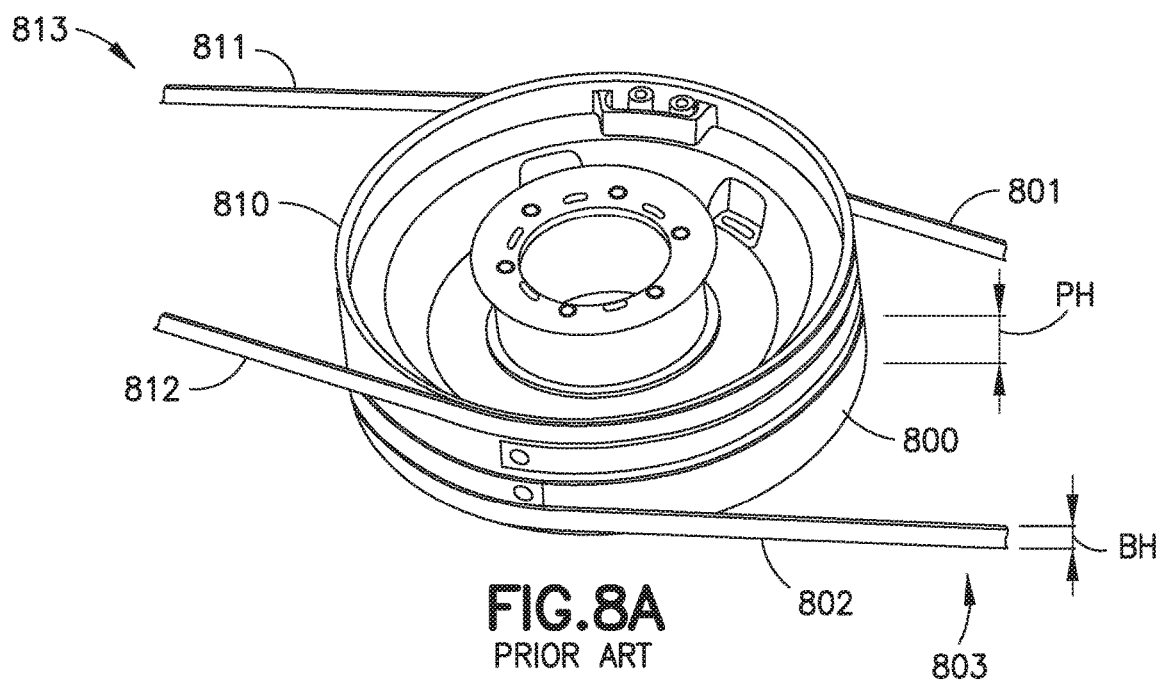
FIGS. 8A and 8B are schematic illustrations of a portion of a conventional substrate transport apparatus.
Figure 8B:
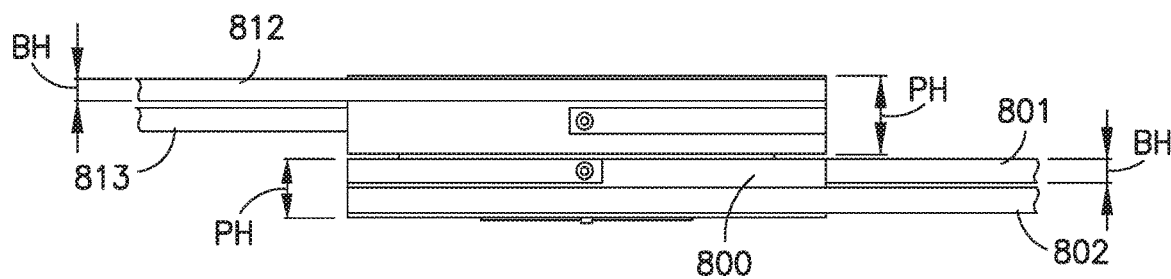

Referring now to FIG. 6A, the transport apparatus 100 will be described in additional detail. As described above, in one aspect, the outer drive shaft 250B is coupled to the upper arm link 120U an a the middle drive shaft 250A is coupled to the upper arm link 110U so that each upper arm link 110U, 120U independently rotates about the shoulder axis of rotation SAX under the motive power of the respective drive shaft 250A, 250B, where the shoulder axis of rotation SAX is shared by the first and second SCARA arms 110, 120. The inner drive shaft 250C is connected to both forearm links 110F, 120F through a splitting drive pulley 606 (see also splitting drive pulley 906 in FIGS. 9A and 9B) that is coupled to the inner drive shaft 250C where the splitting drive pulley 606, 906 is rotatably mounted to rotate, as a unit, at the shoulder axis of rotation SAX of the drive section 106 under the motive power of the inner drive shaft 250C. ID one aspect, the splitting drive pulley 606, 906 is at least partially located within each of the upper arm links 110U, 120U. In other aspects, where the transport apparatus 100 includes two or more SCARA arms (e.g. at least, two) there may be a drive axis for driving each upper arm link of the at least two SCARA arms and additional drive axes for driving at least one splitting drive pulley connected to the forearm links of the at least two SCARA arms, such as where each splitting drive pulley drives rotation of at least two forearms. In one aspect, the splitting drive pulley 606, 906 is coupled to at least two idler pulleys 600, 601 where one of the at least two idler pulleys 600, 601 is connected to the first SCARA arm 110 to effect extension and retraction of the first. SCARA arm 110 and another of the at least two idler pulleys 600, 601 is connected to the second SCARA arm 120 to effect extension and retraction of the second SCARA arm 120.

In one aspect, each of the upper arm links 110U, 120U includes an idler pulley 600, 601 located at a respective one of the elbow axes of rotation EX1, EX2. Each idler pulley 600, 601 is mounted to the respective upper arm link 110U, 120U about the respective elbow axis of rotation EX1, EX2 so as to rotate about the elbow axis of rotation EX1, EX2 independent of the upper arm links 11GU, 120U. For example, any suitable bearings 620A, 620B may be provided within the upper arm links 110U, 120U to which the idler pulleys 600, 601 are mounted for rotation about the elbow axes of rotation EX1, EX2. Each idler pulley 600, 601 is coupled to a respective forearm link 110F, 120F so that the idler pulley 600, 601 rotates as a unit with the respective forearm link 110F, 120F about the respective elbow axis of rotation EX1, EX2.

Each end effector 110E, 120E is slaved to the upper arm link 110U, 120U of the respective SCARA arm 110, 120 so as to maintain alignment of the end effector 110E, 120E along the axis of extension and retraction of each SCARA arm 110, 120. For example, in one aspect, elbow drive pulley 603 is mounted to the upper arm link 110U of SCARA arm 110 about the elbow axis of rotation EX1 in any suitable manner so that the elbow drive pulley 603 is rotatably fixed relative to the upper arm link 110U. Idler pulley 604 is mounted within the forearm link 110F in any suitable manner for rotation about the wrist axis WX1. The end effector 110E is mounted to the idler pulley 604 so as to rotate about the wrist axis WX1 as a unit with the idler pulley 604. The idler pulley 604 is coupled to the elbow drive pulley 603 in any suitable manner such as with a segmented transmission loop 660 having at least two separate bands (substantially similar to band segments 701, 702, 711, 712 described herein), where each of the bands wrap at least partially around the idler pulley 604 and the elbow drive pulley 603 in opposite directions so that as the forearm link 110F moves relative to the upper arm link 110U the relative rotation of the elbow drive pulley 603 with respect to the forearm link 110F at the elbow axis of rotation EX1 causes one of the bands to pull on the idler pulley 604 while the other band pushes on the idler pulley 604 effecting rotation of the idler pulley 604 and maintaining alignment of the end effector 110E along the axis of extension and retraction. Similarly, elbow drive pulley 602 is mounted to the upper arm link 120U of SCARA arm 120 about the elbow axis of rotation EX2 in any suitable manner so that the elbow drive pulley 602 is rotatably fixed relative to the upper arm link 120U. Idler pulley 605 is mounted within the forearm link 120F in any suitable manner for rotation about the wrist axis WX2. The end effector 120E is mounted to the idler pulley 605 so as to rotate about the wrist axis WX2 as a unit with the idler pulley 605. The idler pulley 605 is coupled to the elbow drive pulley 602 in any suitable manner such as with a segmented transmission loop 661 having at least two separate bands (substantially similar to band segments 701, 702, 711, 712 described herein), where each of the bands wrap at least partially around the idler pulley 605 and the elbow drive pulley 602 in opposite directions so that as the forearm link 12 OF moves relative to the upper arm link 120U the relative rotation of the elbow drive pulley 602 with respect to the forearm link 120F at the elbow axis of rotation EX2 causes one of the bands to pull on the idler pulley 605 while the other band pushes on the idler pulley 605 effecting rotation of the idler pulley 605 and maintaining alignment of the end effector 12 0E along the axis of extension and retraction.

Referring also to FIGS. 7A-7C and 9A-9B the splitting drive pulley 606, 906 is coupled to idler pulleys 600, 601 by respective segmented transmission loops 700, 710. The segmented transmission loop 700 includes separate band segments 701, 702 while segmented transmission loop 710 includes separate band segments 711, 712. The band segments 701, 702, 711, 712 of each segmented transmission loop 700, 710 are arranged as opposing bands with respect to a direction of torque from the splitting drive pulley 606, 906 to the respective idler pulley 600, 601 where the respective segmented transmission loops 710, 711 oppose each other from the splitting drive pulley 606, 906 to the respective idler pulleys 600, 601 so that at least the idler pulleys are driven by the splitting drive pulley 606, 906 (and hence the corresponding degree of freedom of the drive section 108) at the same time and in the same direction. If is noted that while two idler pulleys 600, 601 are illustrated as being coupled to the splitting drive pulley, in other aspects, at least two idler pulleys are coupled to the splitting drive pulley so that the motive force provided by the single degree of freedom of the drive section is split between the at least two idler pulleys. Here, the splitting drive pulley 606, 906 is a common pulley splitting one degree of freedom of the drive section between at least the two idler pulleys 600, 601 so as to commonly drive the at least two idler pulleys 600, 601 from the one degree of freedom of the drive section 106. As will be described in greater detail below, the splitting drive pulley 606, 506 has multiple band interface levels or planes at which the band segments 701, 702, 711, 712 are affixed to the splitting drive pulley 606, 906. In one aspect, as will be described below, at least one of the band segments 701, 702, 711, 712 of each respective transmission loop 700, 710 share a common band interface level (e.g. are located in a common plane) so as to have a common band height rather than being disposed one above the other. Accordingly, the splitting drive pulley 606, 906 (which may also be referred to as a shoulder or hub pulley) may be described as being of a compact height compared to conventional shoulder or hub pulleys and correspondingly the dual arm SCARA transport apparatus has a resultant compact height compared to conventional dual arm SCARA transport apparatus.

Referring to FIGS. 9A and 9B, in one aspect, the splitting drive pulley includes two band interface levels 906L1, 906L2 where each band interface level 906L1, 906L2 is a common band interface level. For example, band segment 701 of segmented transmission loop 700 and band segment 712 of segmented transmission loop 710 are coupled to splitting drive pulley 906 at band interface level 906L2 at their respective band anchor points 770, 772 so that the band segments 701, 712 share a common band height BH in a manner similar to that described below with respect to splitting drive pulley 606. Band segment 702 of segmented transmission loop 7 00 and band segment 711 of segmented transmission loop 710 are coupled to splitting drive pulley 906 at band interface level 906L1 at their respective band anchor points 771, 773 so that the band segments 702, 711 share a common band height BH in a manner similar to that described below with respect to splitting drive pulley 606. Here the splitting drive pulley 906 is a one piece unitary member. In other aspects the splitting drive pulley may be constructed of more than one piece as described below.

Referring to FIGS. 6B and 7A-7C, in one aspect, one of the at least two SCARA arms 110, 120 may be a removable SCARA arm. For example, the first SCARA arm 110 may be removable as a unit from the frame 106 while the second SCARA arm 120 remains mounted to the frame 106. In this aspect, the splitting drive pulley 606 is a segmented pulley having a removable pulley segment 606B that includes at least one band interface level so as to remove the pulley segment 606B from the shoulder axis of rotation SAX. The pulley segments 606A, 606B are configured so that the pulley segment 606B can be removed from pulley segment 606A while pulley segment 606A remains fixed to the shoulder axis of rotation and the band segments 701, 702, 711, 712 of each transmission loop 700, 710 for each respective SCARA arm 110, 120 remain fixed to the corresponding pulley segment 606A, 606B. For example, pulley segment 606B may be rotatably mounted to upper arm link 11OU about the shoulder axis of rotation SAX while pulley segment 606A may be rotatably mounted to upper arm link 120U about the shoulder axis of rotation SAX. Band segments 701, 702 of transmission loop 700 are coupled to pulley segment 606B while band segments 711, 712 of transmission loop 710 are coupled to pulley segment 606A. As the SCARA arm 110 is removed from the transport apparatus 100 the pulley segment 606B remains affixed to the upper arm 110U while the pulley segment 606A remains affixed to the upper arm 120U so that the SCARA arm 110 may be removed as a unit with the transmission loop 700 and pulley segment 606B affixed thereto.

In one aspect, each of the pulley segments 606A, 606B includes at least one mating feature that engages a corresponding mating feature of other pulley segment 606A, 606B where the mating features rotatably fix pulley segment 606A to pulley segment 606B so that the pulley segments 606A, 606B rotate as a unit about the shoulder axis of rotation SAX (i.e. the pulley segments are keyed to one another in a predetermined rotational orientation). For example, in one aspect, pulley segment 606A includes mating surface 730 that mates with mating surface 710 of pulley segment 606B. Pulley segment 606A may also include mating surface 731 that mates with mating surface 741 of pulley segment 606B. While mating surfaces 730, 731, 740, 741 are illustrated and described for rotatably fixing the pulley segments 606A, 606B so that the pulley segments rotate as a unit about the shoulder axis of rotation SAX, in other aspects the pulley segments 606A, 606B may be rotatably fixed in any suitable manner such as with one or more of pins, clips, shoulder bolts or any other suitable fasteners. As may be realized from FIGS. 6A-6B the compact height of the SCARA arm in the aspects of the disclosed embodiment may be readily reconfigured from two SCARA arm to one SCARA arm and vice versa. Further, the exemplary arm configuration illustrated in FIGS. 6A-6B has at least one SCARA arm that is interchangeable or may be swapped as a unit as previously described.

As can be seen in FIGS. 7A-7D the splitting drive pulley 606 includes three band interface levels 606L1, 606L2, 606L3 that accommodate the four band segments 701, 702, 711, 712 of the two transmission loops 700, 710. In one aspect, the removable pulley segment 606B includes band interface level 606L1 and interface level portion 606L2B of band interface level 606L2. Pulley segment 606A includes interface level portion 606L2A of band interface level 606L2 and interface level 606L3. In this aspect, band segment 701 is coupled to interface level 606L1 of pulley segment 606B at band anchor point 770 while band segment 702 is coupled to interface level portion 606L2B of pulley segment 606B at band anchor point 771. Band segment 712 is coupled to band interface level 606L3 of pulley segment 606A at band anchor point 772 while band segment 711 is coupled to interface level portion 606L2A of pulley segment 606A at band anchor point 773 so that band interface level 606L2 is common to both band segment 702 and band segment 711.

Referring also to FIGS. 7E-7H, the location of each band anchor point 770-773 on the splitting drive pulley 606, 609 defines a band engagement arc A1, A2, A11, A12 with the splitting drive pulley 606 so that the included angle of rotation a1, a2, a11, a12, between the band engagement arc A1, A2, A11, A12 and a tangent point T1, T2, T11, T12 at which the band anchor point 770, 771, 772, 773 forms a tangent between the respective band segment 701, 702, 711, 712 and the splitting drive pulley 606, is about 90 degrees or less.

Referring to FIGS. 7A-7H, in one aspect the splitting drive pulley 606, 609 and the at least two idler pulleys 600, 601 to which the splitting drive pulley 606, 609 is coupled by the transmission loops 700, 710 have any suitable drive ratio that provides sufficient rotation of the respective forearm links 110F, 120F to extend and retract the SCARA arms 110, 120 for picking and placing substrates from and to predetermined substrate holding locations arranged a predetermined distance away from the shoulder axis SAX. For example, the ratio between the splitting drive pulley 606, 609 and each of the idler pulleys 600, 601 is configured so that the band anchor point 770, 771, 772, 773 location on the splitting drive pulley 606, 609 is so that the angle of rotation 3 (see FIGS. 3A and 3B) for each SCARA arm 110, 120 extension motion (i.e. the drive axis rotation to effect idler pulley 600, 601 rotation for full extension and retraction of the arm SCARA 110, 120) results in at least one arc (e.g. arcs A1, A2, A11, A12) on the splitting drive pulley 606, 609 so that a band anchor point 770, 771, 772, 773 of one band segment 701, 702, 711, 712 at one end E1 of the arc A1, A2, A11, A12 is no more than coincident with the band anchor point 770, 771, 772, 773 of an opposing band segment 701, 702, 711, 712 on the same or different band interface level 606L1, 606L2, 606L3. For example, as illustrated in FIGS. 7A-7C and 9A band anchor points 770, 771 for opposing band segments 701, 702 are located substantially one above the other and band anchor points 772, 773 of opposing band segments 711, 712 are located substantially one above the other. In other aspects, the band anchor points 770, 771, 772, 773 may be circumferentially separated from the band anchor point 770, 771, 772, 773 of the opposing band segment. 701, 702, 711, 712 by any suitable amount. In the example shown in FIGS. 7A-7H and 9A-9B the band anchor points 770, 771 are illustrated as being about 180 degrees apart from band anchor points 772, 773 so that about ±90 degree rotation of the splitting drive pulley 606, 906 results in about a ±180 degree rotation of the idler pulleys 600, 601 but in other aspects, where the drive ratio of the splitting drive pulley 606, 906 to the idler pulleys 600, 601 is greater than about 2:1 (as described below) the relative location between the band anchor points along the circumference of the splitting drive pulley may be different than about 180 degrees apart.

On the other end E2 of the arc A1, A2, A11, A12 the band anchor point 770, 771, 772, 773 is positioned so that the included angle of rotation α1, α2, α11, α12, between the end E1 of the band engagement arc A1, A2, A11, A12 and the tangent point T1, T2, T11, T12 is about 90 degrees or less (i.e. the band segment 701, 702, 711, 712 is tangent to the splitting drive pulley 606 and is in pure tension with no bending of the band segment 701, 702, 711, 712 around the splitting drive pulley 606, 906).

In one aspect, the splitting drive pulley 606, 906 and the idler pulleys 600, 601 may have about a 2:1 ratio so that about a ±90 degree rotation of the splitting drive pulley 606, 906 (e.g. corresponding to the band engagement arcs A1, A2, A11, A12) effected by the controller 190 causes about ±180 degrees of rotation of each idler pulley 600, 601. As noted above, in other aspects, the drive ratio between the splitting drive pulley 606, 906 and the idler pulleys 600, 601 may be greater than about 2:1. For example, the drive ratio between the splitting drive pulley 606, 906 and the idler pulleys 600, 601 may be about 2.5:1, about 3:1, about 4:1 or any other suitable drive ratio configured to effect full extension an a retraction of the SCARA arms 110, 120 and/or rotation of one SCARA arm 110, 120 about the shoulder axis SAX relative to the other SCARA arm 110, 120 (see e.g. FIGS. 5A-5G) as described herein. As may be realized, where the drive ratio between the splitting drive pulley 606, 906 and the idler pulleys 600, 601 is greater than about 2:1 the controller 190 is configured to effect any suitable amount of rotation of the splitting drive pulley 606, 906, depending on the drive ratio, to fully extend and retract the SCARA arms 110, 120.

Figure 10A:
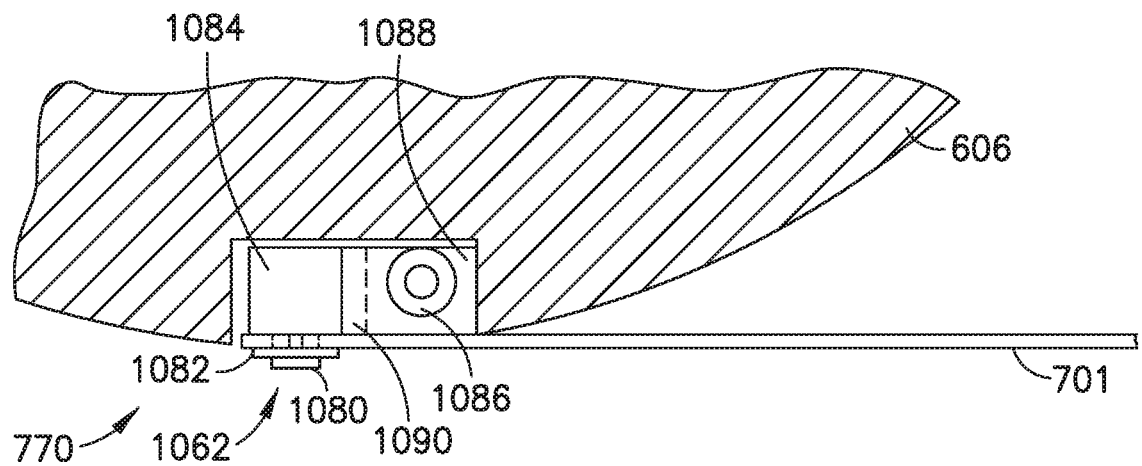
FIGS. 10A and 10B are schematic illustrations of portions of a substrate transport apparatus in accordance with one or more aspects of the disclosed embodiment.
Figure 10B:
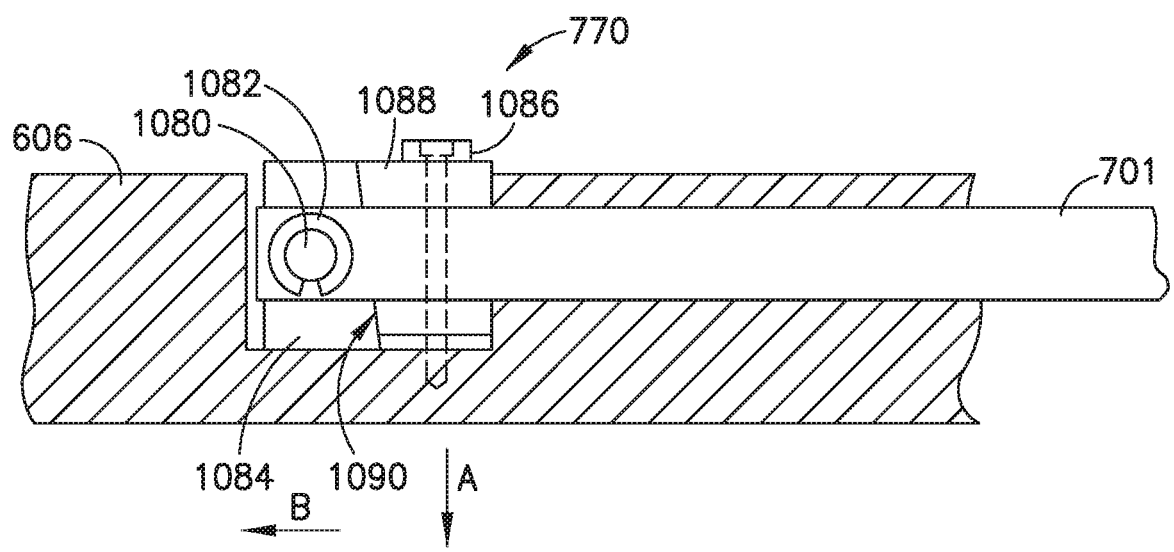

Referring to FIGS. 10A and 10B the band anchor points 770-773 (only band anchor point 770 is illustrated but it should be understood that the other band anchor points are substantially similar to that described with respect to band anchor point 770) couple the respective band segments 701, 702, 711, 712 to the splitting drive pulley 606, 906. Further, while the band anchor points are described with respect to splitting drive pulley 606 it should be understood that the splitting drive pulley 906 (and the band anchor points for pulleys 600, 601, 602, 603, 604, 605) is substantially similar. For example, in one aspect, each band anchor point 770-773 includes a base 1084 to which a pin 1062 is mounted. The ends of each band segment 701, 702, 711, 712 include a hole through which a spoke 1080 of the pin 1062 projects. A retaining spring clip 1082, or other suitable retainer, is attached to the spoke 1080 to secure the band segment 701, 702, 711, 712 to the spoke 1080. The spoke 1080 projects from the base 1084 to provide an attachment location for the band segment 701, 702, 711, 712. In other aspects, the spoke 1080 could project directly from a circumferential edge or side of the splitting drive pulley 606, 906. In one aspect the hole in the band segment 701, 702, 711, 712 is slightly larger than the spoke 1080 and the retaining clip 1082 does not hold the band segment 701, 702, 711, 712 tightly so that the band segment 701, 702, 711, 712 is free to pivot around the spoke 1080. In one aspect, the base 1084 is an adjustable base that provides for location adjustment of the pin 1062 to thereby adjust the tension of the band segment 701, 702, 711, 712. For example, a screw 1086 passes into a threshold opening in the splitting drive pulley 606, 906 and holds a tightening wedge 1088 adjacent the splitting drive pulley 606, 906. One face of the tightening wedge 1088 engages a diagonal face 1090 of the base 1084. To increase the tension in the band segment 701, 702, 711, 712, screw 1086 is tightened, pushing tightening wedge 1088 down in the direction of arrow A. This pushes wedge 1088 against diagonal surface 1090, thereby forcing base 1084 to slide in the direction of arrow B. Conversely, to decrease the tension in the band segment 701, 702, 711, 712, screw 1086 is loosened. In other aspects, the band segments 701, 702, 711, 712 may be coupled to the splitting drive pulley 606, 906 and the other pulleys 600, 601, 602, 603, 604, 605 of the transport arm 100 in any suitable manner. Suitable examples of band anchor points may be found in U.S. Pat. No. 5,778,730 issued on Jul. 14, 1998, the disclosure of which is incorporated herein by reference in its entirety.

Figure 11A:
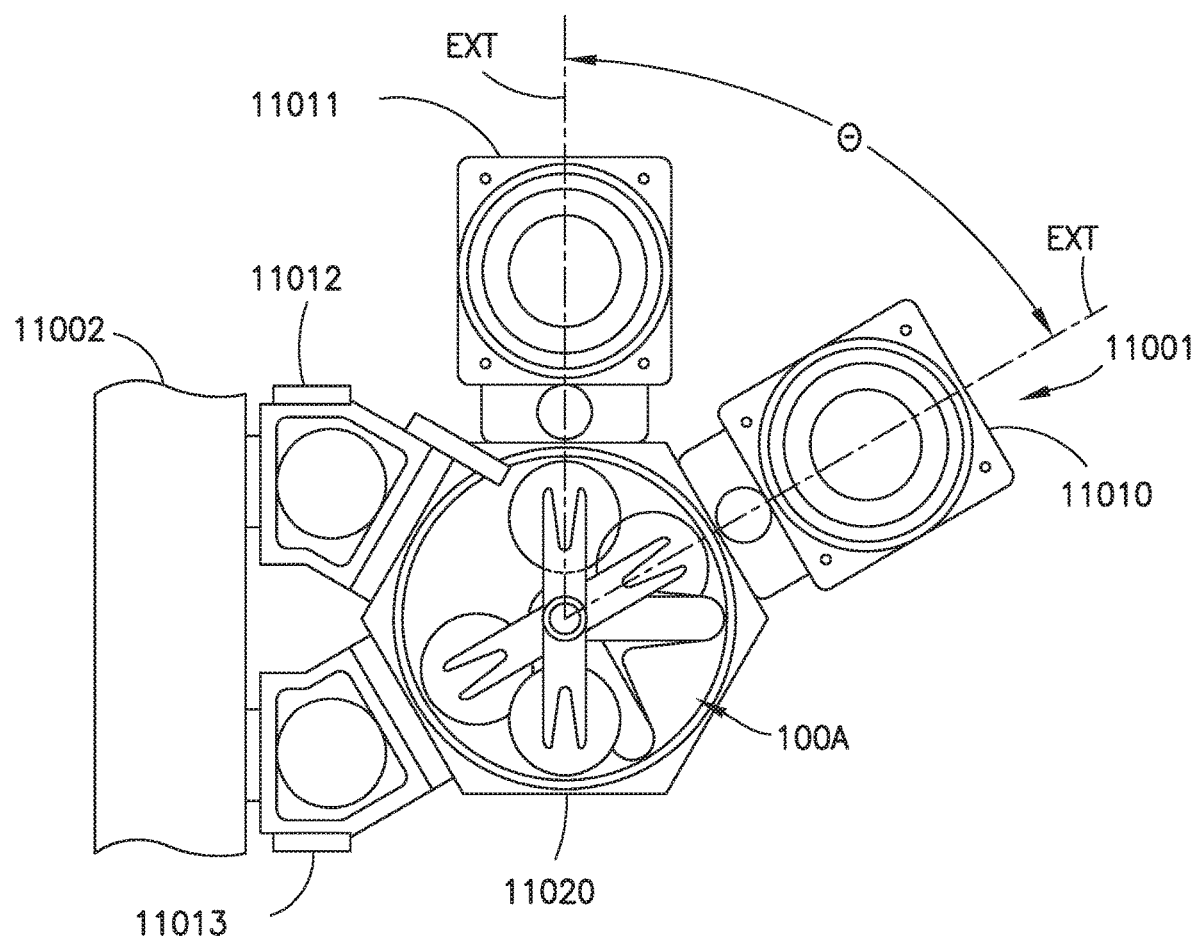
Figure 11B:
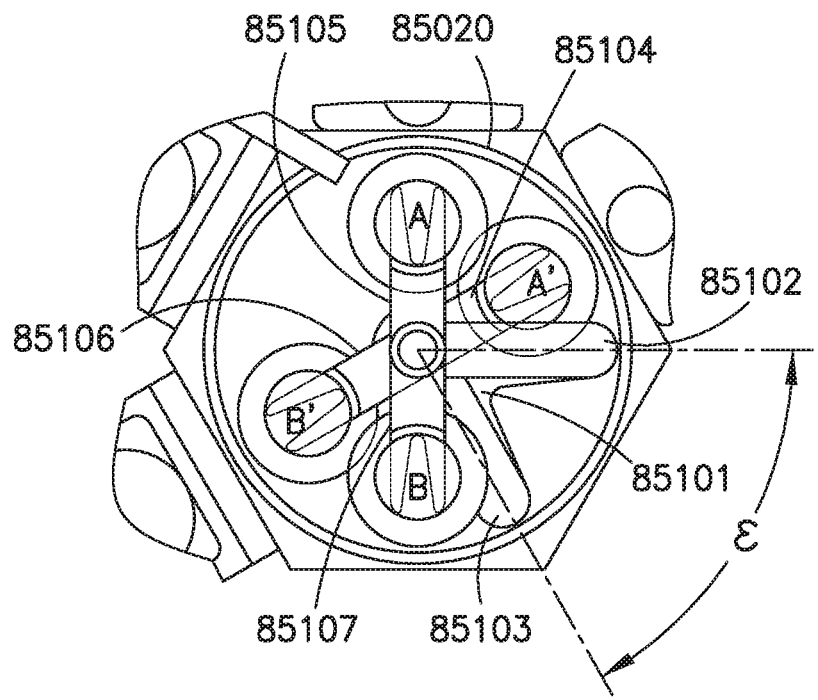
Figure 11C:
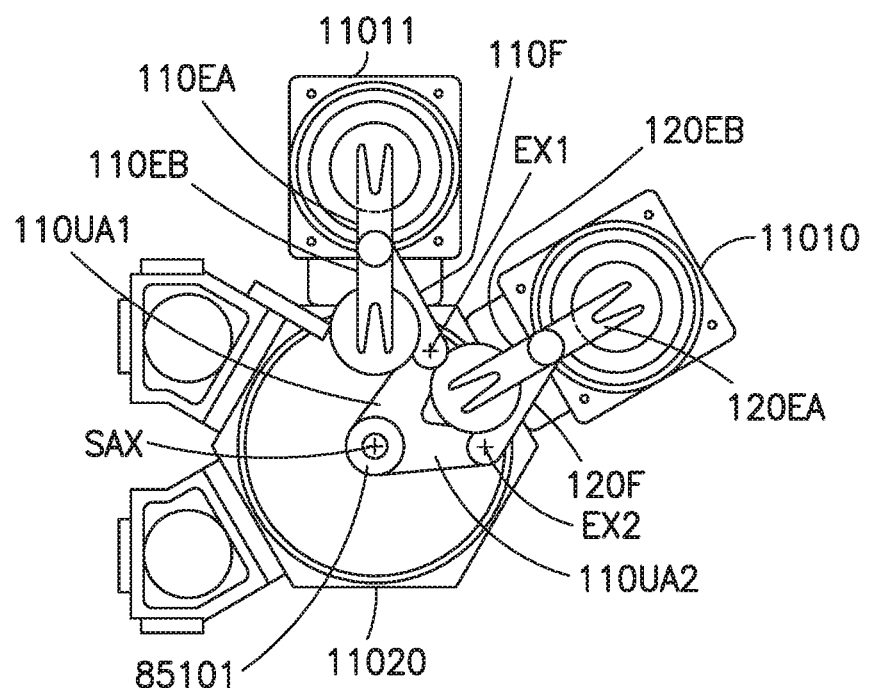

Referring now to FIGS. 11A-11E, transport apparatus 100A, which is substantially similar to transport apparatus 100 described above, includes a SCARA arm having at least two end effectors that, are driven by a common drive axis of drive section 108. In FIGS. 11A-11C a portion of a processing tool 11001 is shown in accordance with an aspect of the disclosed embodiment. The processing tool 11001 may be any suitable processing tool having an equipment front end unit 11002, a transfer chamber 11020, load locks 11012, 11013 connecting the transfer chamber 11020 to the front end unit 11002, and process modules 11010, 11011 coupled to the transfer chamber 11020. The transport apparatus 100A is located at least partially within the transfer chamber 11020 for transferring substrates between the process modules 11010, 11011 an a the load lock modules 11012, 11013.

The transport apparatus 100A includes an upper arm 110UA, forearm 110F, 120F rotatably coupled to the upper arm 110UA and end effectors 110EA, 110EB, 120EA, 120EB rotatably mounted to respective ones of the forearm 110F, 120F. It is noted that the end effectors 110EA, 110EB, 120EA, 120EB may have any suitable configuration for holding one or more than one substrate. For example, where each end effector 110EA, 110EB, 120EA, 120EB holds more than one substrate the substrates may be held in either a stacked or side by side configuration for transferring batches of substrates with a single arm. It is also noted that the upper arm 110UA and forearms 110F, 120F may have unequal lengths from joint center to joint center or in other aspects, the upper arm 110UA and forearms 110F, 120F may have equal lengths from joint center to joint center.

In one aspect, the upper arm 110UA may be a substantially rigid link having a substantially "U" or "V" shape that extends away from the shoulder axis of rotation SAX of the transport apparatus 100A. The upper arm 110UA may include a first portion 110UA1 and a second portion 110UA2 that are releasably rotationally coupled at, for example, the shoulder axis of rotation SAX (or any other suitable point on the upper arm link) in a manner substantially similar to that described in U.S. patent application Ser. No. 11/148,871 entitled "Dual SCARA Arm" and filed on Jun. 9, 2005 (the disclosure of which is incorporated herein by reference in its entirety) so that when the coupling between the first and second portions is released the elbow axes EX1, EX2 can be rotated towards or away from each other about the shoulder axis of rotation SAX to change or adjust the angle ε between the first and second portions 110UA1, 110UA2 and when the coupling is not released the first and second portions form the substantially rigid upper arm 110UA. It is noted that the angle ε may be dynamically adjustable when, for example, each portion 110UA1, 110UA2 of the upper arm 110UA is connected to its own drive shaft of the drive system for driving movement of the arm. For example, when the first and second portions 110UA1, 110UA2 are in a substantially rigid configuration respective drive axes of the drive system are moved in unison and where the angle ε is to be adjusted the respective drive axes of the first and second portions are moved in one of opposite directions, at difference rates in the same direction or in any other suitable manner for dynamically changing or adjusting the angle ε.

The forearm 110F may be rotatably coupled to the upper arm 110UA about elbow axis EX1 and forearm 120F may be rotatably coupled to the upper arm 110UA about elbow axis EX2. Each forearm 110F, 120F may have two independently rotatable end effectors 110EA, 110EB, 120EA, 120EB. For example, end effectors 110EA, 120EB may be independently rotatably mounted to forearm 110F about wrist axis EX1 and end effectors 120EA, 120EB may be independently rotatably mounted to forearm 120F about wrist axis EX2. In one aspect the end effectors may be disposed so that they have a common transfer plane while in other aspects the end effectors may be disposed on substantially proximate or different transfer planes. The dual end effectors on each forearm 110F, 120F allows for the fast swapping of substrates at a substrate holding location such as the process modules 11010, 11011 or load lock modules 11012, 11013. It should be understood that while two end effectors are shown coupled to each forearm 110F, 120F, that any suitable number of end effectors can be rotatably coupled to each forearm 110F, 120F each being configured to hold any suitable number of substrates in, for example, a stacked arrangement or a side by side arrangement in a manner similar to that described above.

In this aspect, drive shaft 250B of the drive section 108 is coupled to the upper arm 110UA so that the drive shaft 250B and the upper arm 110UA rotate as a unit about the shoulder axis of rotation SAX. Drive shaft 250C of the drive section 108 is coupled to forearm drive pulley 1100 so that the drive shaft 250C and the forearm drive pulley 1100 rotate as a unit about the shoulder axis of rotation SAX. Here the forearm drive pulley 1100 is coupled to forearm idler pulley 600 in any suitable manner, such as by a segmented transmission loop 700C which is substantially similar to segmented transmission loop 700 described above. The forearm idler pulley 600 is coupled to the forearm 110F so that the forearm 110F and the forearm idler pulley 600 rotate as a unit about the elbow axis of rotation EX1 so that rotation of drive shaft 250C causes rotation of the forearm 110F about the elbow axis of rotation EX1. While only forearm 110F is illustrated in FIG. 11D it should be understood that the forearm pulley 1100 may be coupled to forearm 120F in a manner substantially similar to that described above with respect to forearm 110F so that the forearms 110F, 120F are commonly driven (e.g. extended and retracted) by drive shaft 250C of the drive section 108 where the pulley 1100 may be substantially similar to splitting drive pulley 906 described above. The drive shaft 250A is coupled to splitting drive pulley 906A, which in one aspect, is substantially similar to splitting drive pulley 906 described above. In one aspect, the splitting drive pulley 906 is coupled to idler pulley 603I by segmented transmission loop 700A which is substantially similar to segmented transmission loop 700 described above. The idler pulley 603I is coupled to end effector drive pulley 603D so that the idler pulley 603I an end effector drive pulley 603D rotate as a unit about the elbow axis EX1. The end effector drive pulley 603D is coupled to end effector idler pulley 604 in any suitable manner such as by a segmented transmission loop 600 similar to those described above so that rotation of the end effector drive pulley 603D causes rotation of the end effector 110EA (which is coupled to rotate as a unit with the end effector idler pulley 604) about, the wrist axis of rotation WX1.

Here the splitting drive pulley 906A is also coupled to a reversing transmission that includes, for example, pulleys 690, 691 and segmented transmission loops 710R, 710A. In other aspects, the reversing transmission may be any suitable transmission for changing a direction of motive rotation of splitting drive pulley 906A so that end effectors 110EA, 110EB are rotated at the same time in opposite directions as described below. In one aspect, the splitting drive pulley 906A is coupled to pulley 690 by segmented transmission 710R that includes band segments 711R, 712R. The band segments 711R, 712R couple the splitting drive pulley 906A and the pulley 690 at different band interface levels (similar to band segments 711, 712 in FIGS. 9A and 9B) and are located one above the other so as to cross one another for effecting opposite rotation of the splitting drive pulley 906A and the pulley 690. For example rotation of splitting drive pulley 906A in a first direction (e.g. direction CW) causes rotation of pulley 690 in the opposite second direction (e.g. direction CCW).

As can be seen in FIG. 11D the band anchor points 772R, 773R are circumferentially spaced apart from one another (rather than coincident with each other) so that an about ±90 degree rotation of splitting drive pulley 906A causes about a ±90 degree reverse rotation of pulley 690 and about a ±180 degree rotation of idler pulley 603I in the same direction as splitting drive pulley 609A (e.g. where the drive ratio between the splitting drive pulley 906A and the idler pulley 603I is about 2:1 and the drive ratio between the splitting drive pulley 906A and the pulley 690 is about 1:1—noting that in other aspects any suitable drive ratios may be used).

The pulley 690 is coupled to pulley 691 about reversing axis 1110 so that pulleys 690, 691 rotate as a unit about the reversing axis 1110. While two separate pulleys 690, 691 are shown, in other aspects pulleys 690, 691 may form a single unitary member similar to splitting drive pulley 906 described above. The pulley 691 is coupled to idler pulley 906B by any suitable transmission such as segmented transmission loop 710A which is substantially similar to the segmented transmission loops described above. In this aspect, the idler pulley 906B is rotatably mounted about the shoulder axis of rotation SAX but in other aspects the idler pulley can be mounted within the upper arm 110UA at any suitable location. The idler pulley 906B is coupled to idler pulley 602I in any suitable manner such as with segmented transmission loop 700B which is substantially similar to the segmented transmission loops described above. The idler pulley 602I is rotatably mounted within the upper arm 110UA about the elbow axis of rotation EX1 is coupled to end effector drive pulley 602D so as to rotate about the elbow axis EX as a unit with end effector drive pulley 602D. The end effector drive pulley 602D is coupled to end effector idler pulley 605 by any suitable transmission such as segmented transmission loop 661 which is substantially similar to the segmented transmission loops described above. The end effector idler pulley 605 is rotatably mounted about the wrist axis WX1 and is coupled to end effector 110EB so as to rotate as a unit with the end effector 110EB about the wrist axis WX1.

As may be realized the rotation of shaft 250A in a first direction causes end effectors 110EA, 120EA to rotate in the first direction. The rotation of shaft 250A also causes the end effectors 110EB, 120EB to rotate in the opposite second direction (e.g. opposite the first direction) due to, for example, their connection to the drive shaft 250A through the reverse transmission formed in part by pulleys 690, 691 and segmented transmission loops 710R, 710A. As such, the end effectors 110EA, 110EB, 120EA, 120EB are coupled to a common drive shaft 250A for causing opposite rotation of the end effectors of each arm for effecting the fast swapping of substrates.

Referring again to FIGS. 11A-11C, in operation, to rotate the transport apparatus 100A as a unit about the shoulder axis SAX the drive shafts 250A-250C may be rotated in the same direction at substantially the same speed. To substantially simultaneously extend and retract the arms (e.g. radially move the end effectors into and out of the substrate holding locations) along respective axes of extension and retraction EXT for picking and placing substrates, the middle shaft 250A may be held substantially stationary while the shafts 250B, 250C are rotated in the same direction to effect the radial extension and retraction of the end effectors as illustrated in FIG. 11C (which shows extension of the end effectors into the process modules 11010, 11010). To effect the fast swapping of substrates held by the end effectors the middle shaft 250A is rotated while the shafts 250B, 250C are held substantially stationary so that end effectors 110EA, 120EA are rotated in the first direction and end effectors 110EB, 120EB are rotated (through the reverse transmission) in the second (opposite) direction so that end effectors 110EB, 120EB are pointed towards and aligned with the desired substrate holding locations.

As may be realized the pulley and transmission configuration shown and described for transport apparatus 110A are merely exemplary and that other configurations may exist that allow the fast swap of the end effectors in a manner substantially similar manner to that described herein.

The end effectors 110EA, 110EB, 120EA, 120EB may be oriented on the respective forearm links 110F, 120F so that an angle $\theta$ between the end effectors is substantially the same as the angle between the substrate holding locations (e.g. process modules 11010, 11011 and load locks 11012, 11013) as shown in FIG. 16A. As noted above, in one aspect the end effectors may also be located at different vertical heights (e.g. in different substrate transfer planes). The process modules 11010, 11011 and the load locks 11012, 11013 may be configured to have different wafer transfer planes that correspond to the different vertical heights of the end effectors as described in U.S. patent application Ser. No. 13/293,717 filed on Nov. 10, 2011. In other aspects the Z-drive 190 of the drive section 108 may be configured to raise and lower the end effectors by the same amount or different amounts (e.g. the Z-drive may be configured to vertically move the end effectors 110EA, 110EB of one forearm 110F independently of vertical movement of the end effectors 120EA, 120EB of the other forearm 120F) for picking and placing the substrates at the substrate holding locations. In yet another aspect the substrate holding locations may include Z-drives for changing the wafer transfer plane of the substrate holding location depending on the end effector being used to pick or pace a substrate from a corresponding substrate holding station.

Figure 12:
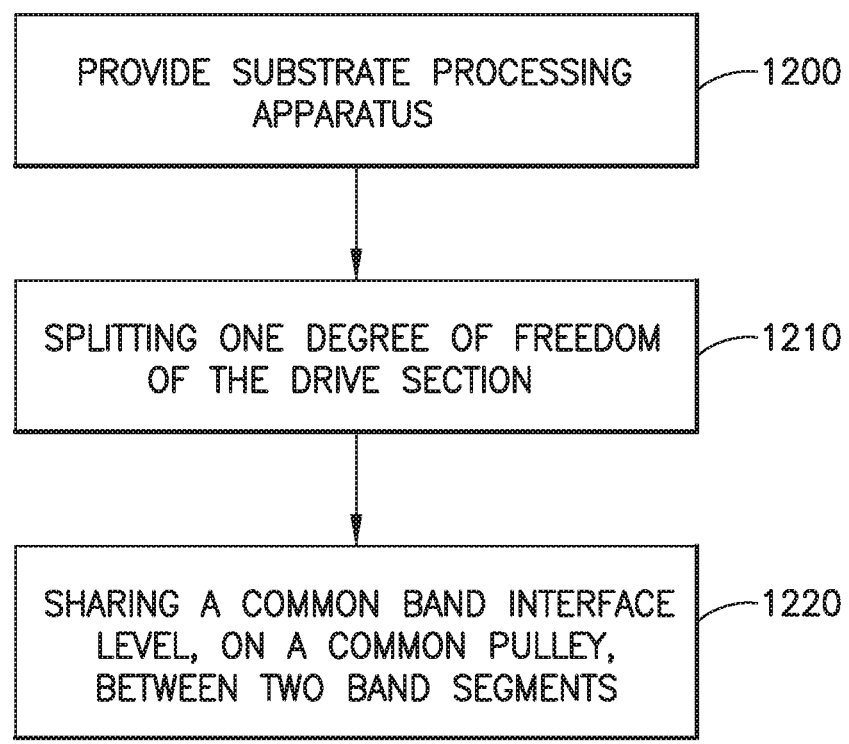
FIG. 12 is a flow diagram in accordance with one or more aspects of the disclosed embodiment.

In the aspects of the disclosed embodiment described herein, the transport apparatus 100, 100A is provided in any suitable atmospheric or vacuum transfer chamber (FIG. 12, Block 1200). The transfer chamber may be substantially similar to transfer chambers 5020, 11020, which may contain a vacuum atmosphere, and/or front end module 11002 which may contain an atmospheric pressure. As described above, one degree of freedom of the drive section 108 is split between at least two idler pulleys 600, 601 so as to commonly drive the at least two idler pulleys 600, 601 from the one degree of freedom drive section (FIG. 12, Block 1210). As also described above, a common band interface level 606L1-606L3 of the splitting drive pulley 606, 906 is shared between at least one band segment 701, 702, 711, 712 of each segmented transmission loop 700, 710 (FIG. 12, Block 1220).

Referring again to FIGS. 2, 5A-5G, 7A-7D and also to FIGS. 13A-13C, in one aspect, the drive section 108 includes a limited pulley segment drive 108L configured to cause relative movement between pulley segment 606A and pulley segment 606B so that the SCARA arms 110, 120 may be rotated relative to one another about the shoulder axis of rotation SAX. For example, the SCARA arms 110, 120 illustrated in FIGS. 5A-5G have end effectors 110E, 120E that are located in the same plane (in other aspects the end effectors may be located on different planes). Here each SCARA arm 110, 120 accesses substrate process modules PM1-PM4 where, for example, SCARA arm 110 is movable relative to SCARA arm 120 so as to access any one of process modules PM2-PM4 while an axis of extension and retraction 400R of SCARA arm 120 is substantially aligned with process module PM1. To rotate SCARA arm 110 relative to SCARA arm 120 the limited pulley segment drive 108L may be disposed between the pulley segments 606A, 606B so that the limited pulley segment drive 108L is coupled to both pulley segments 606A, 606B. In other aspects, the limited pulley segment drive 108L may be disposed at any location within the upper arms 110U, 120U for effecting relative rotation between pulley segments 606A, 606B. The limited pulley segment drive 108L may be any suitable drive for effecting relative movement between the pulley segments 606A, 606B such as, for example, a solenoid, a stepper motor, a linear actuator, or a rotary actuator. In one aspect, a base 108LS of the limited pulley segment drive 108L may be mounted to pulley segment 606A (which is coupled to drive shaft 250C) while a moveable portion 108LM of the limited pulley segment drive 108L may be coupled to pulley segment 606B. The limited pulley segment drive 108L is coupled to controller 199 in any suitable manner so as to receive control signals for actuating the limited pulley segment drive 108L. In one aspect, the mating surfaces 730, 731, 740, 741 of the pulley segments 606A, 606B may be circumferentially spaced apart from one another by any suitable distance D where the distance D corresponds to the angle 92 of relative movement between the pulley segments 606A, 606B and hence the SCARA arms 110, 120. To accommodate larger angles of relative movement a portion 606AP, 606BP of the pulley segments 606A, 606B along which the band segments 701, 702, 711, 712 interface (such as on band interface level 606L2) may be retractable so that as the corresponding mating surfaces 730, 731, 740, 741 contact one another the portions 606AP, 606BP move in direction 1111 relative to their respective pulley segments 606A, 606B. In still other aspects, the drive ratio between the pulley segments 606A, 606B and the idler pulleys 600, 601 may also be increased to provide relative rotation between the SCARA arms 110, 120 about the shoulder axis of rotation SAX.

In operation, the SCARA arms 110, 120 may be aligned so that an axis of extension and retraction 400R of end effector 110E is aligned with process module PM2 and an axis of extension and retraction 400R of end effector 120E is aligned with process module PM1. In one aspect, SCARA arm 110 may be rotated relative to SCARA arm 120 so that the end effector 110E is aligned with one of process modules PM2-PM4 where at least the limited pulley segment drive 108L is actuated to rotate pulley segment 606A relative to pulley segment 606B by a predetermined amount so that the location of band anchor points 770, 771, 772, 772 of each segmented transmission loop 700, 710 change relative to one another about shoulder axis SAX (as can be seen in FIG. 13A) and the end effector 110E of SCARA arm is aligned with a predetermined one of the process modules PM2-PM4. In one aspect, one or more of the drive shafts 250A-205C may be rotated in addition to actuation of the limited pulley segment drive 108L to effect relative rotation of the SCARA arms 110, 120 and maintain alignment of one or more of the end effectors 110E, 120E with a predetermined process module PM1-PM4.

Referring to FIGS. 14A-17B, in one aspect, one or more of the upper arms 110U, 120U and forearms 110F, 120F of the SCARA arms 110, 120 of the transport apparatus 100, 100A described herein include a passive band tensioner 1600, 1700 to maintain a constant tension in the band segments 701, 702, 711, 712. It should be understood that while a dual SCARA arm is shown in the Figs. for non-limiting exemplary purposes, the aspects of the disclosed embodiment described herein may be applied to any substrate transport apparatus configuration that includes a banded transmission for driving one or more of the arm links of the substrate transport apparatus. For example, the aspects of the disclosed embodiment described herein may be applied to single SCARA arm, dual SCARA arm, frog-leg arms and/or any other suitable transport arm. In one aspect, referring to FIGS. 14A-14B, 15, 16A-16B and 17A-17B the passive band tensioner 1600, 1700 described herein depends on static physical (e.g. thermal expansion) properties of the materials (or in other words properties of the material when static), from which the passive band tensioner 1600, 1700 is constructed, and thus the tensioner is referred to as passive. In particular, different materials have different coefficients of thermal expansion. In one aspect, the upper arms 110U, 120U, forearms 110F, 120F and pulleys (e.g. splitting drive pulley 606 and pulleys 600-605) are constructed of aluminum while the band segments 701, 702, 711, 712 are constructed of stainless steel (in other aspects, any suitable materials may be used having any suitable coefficients of thermal expansion). The passive band tensioner 1600, 1700 described herein includes at least one linkage and at least one pulley disposed within one or more of the upper arms 110U, 120U and forearms 110, 120F where the linkages and pulleys of the band tensioner 1600, 1700 are constructed of a different material than one or more of the upper arms 110U, 120U, forearms 110F, 120F and pulleys 600-605 to compensate for thermal expansion changes of the upper arms 110U, 120U, forearms 110F, 120F and pulleys 600-605.

Figure 16:
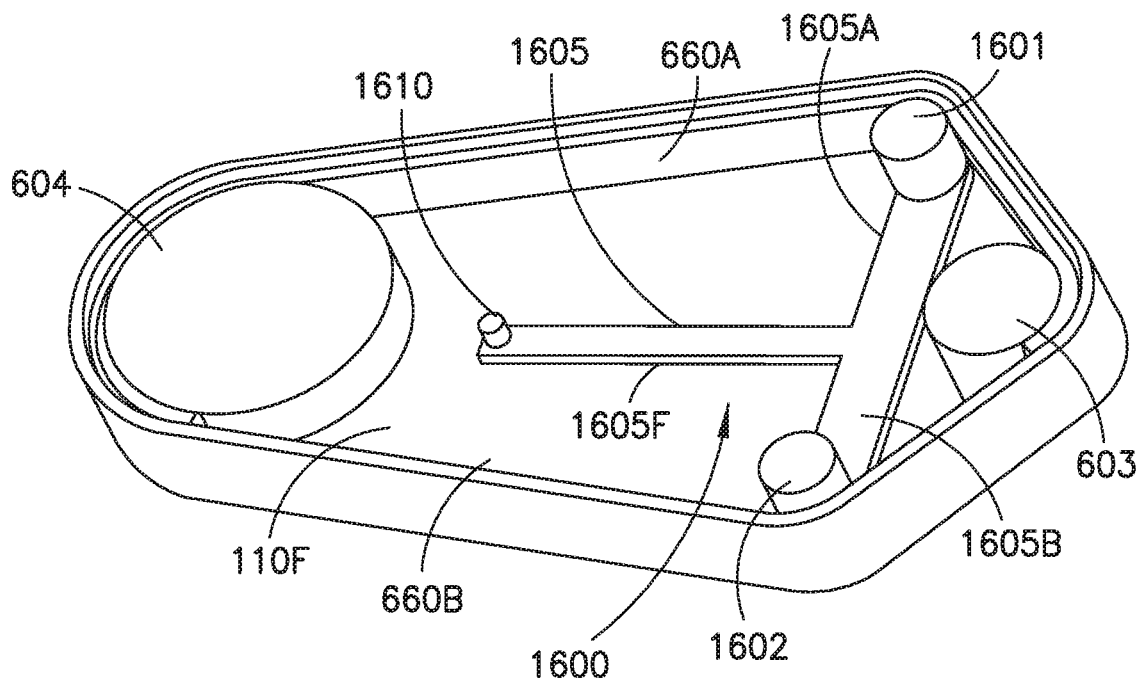
FIG. 16 is a schematic illustration of a portion of a substrate transport in accordance with one or more aspects of the disclosed embodiment.

Referring to FIG. 16, the passive band tensioner 1600 is located substantially between pulleys 603, 604 of the forearm 110F and includes a tensioner bar 1605 and at least two tensioner pulleys 1601, 1602. The tensioner bar 1605 includes a frame 1605F and lateral extensions 1605A, 1605B extending laterally in substantially opposite directions from the frame 1605F. The frame is rotatably coupled to the forearm 110F in any suitable manner such as with a pin 1610 or other suitable fastener that provides movement between the tensioner bar 1605 and the forearm 110F. Tensioner pulleys 1601, 1602 are located on the lateral extensions 1605A, 1605B so as to interface with the respective band segments 660A, 660B of the segmented transmission loop 660. It is noted that in other aspects, the passive band tensioner may have any suitable configuration.

For exemplary purposes only, referring to elbow pulley 603, wrist pulley 604 and segmented transmission loop 660 of forearm 110F and FIGS. 14A-14B, the effective wrist pulley radius R1 is $$R1 = Pr + Bth/2 \qquad [1]$$

and the effective elbow pulley radius R2 is $$R2 = Pe + Bth/2 \qquad [2]$$

where Pr an a Pe are the radius of the wrist pulley 604 and elbow pulley respectively, and Bth is the thickness of the band segment 660A, 660B of the segmented transmission loop 660 noting that AC=pulley center to center distance
BC=free length of the band 660A, 660B segment $$AB = R1 - R2 \quad [3]$$

$$AC^2 = AB^2 = BC^2 \quad [4]$$

$$BC = \sqrt{AC^2 - (R1*R2)^2} \quad [5]$$

$$\cos\beta2 = \frac{AB}{AC} \quad [6]$$

$$\beta2 = \cos^{-1}\left(\frac{R1-R2}{AC}\right) \quad [7]$$

Given equations [1]-[7] the band wrap around the wrist LW can be calculated as $$Lw = R1\pi + R1\left(\frac{\pi}{2} - \beta2\right) \quad [8]$$

$$Lw = R1\pi + R1\left(\frac{\pi}{2} - \cos^{-1}\left(\frac{R1-R2}{AC}\right)\right) \quad [9]$$

The band warp around the elbow Le can be calculated as $$Le = R2\pi + R2\left(\frac{\pi}{2} - \beta2\right) \quad [10]$$

$$Lw = R2\pi + R2\left(\frac{\pi}{2} - \cos^{-1}\left(\frac{R1-R2}{AC}\right)\right) \quad [11]$$

And the total band segment length $L_{band}$ can be calculated as $$L_{band} = Lw + Le + BC \quad [12]$$

Figure 15:
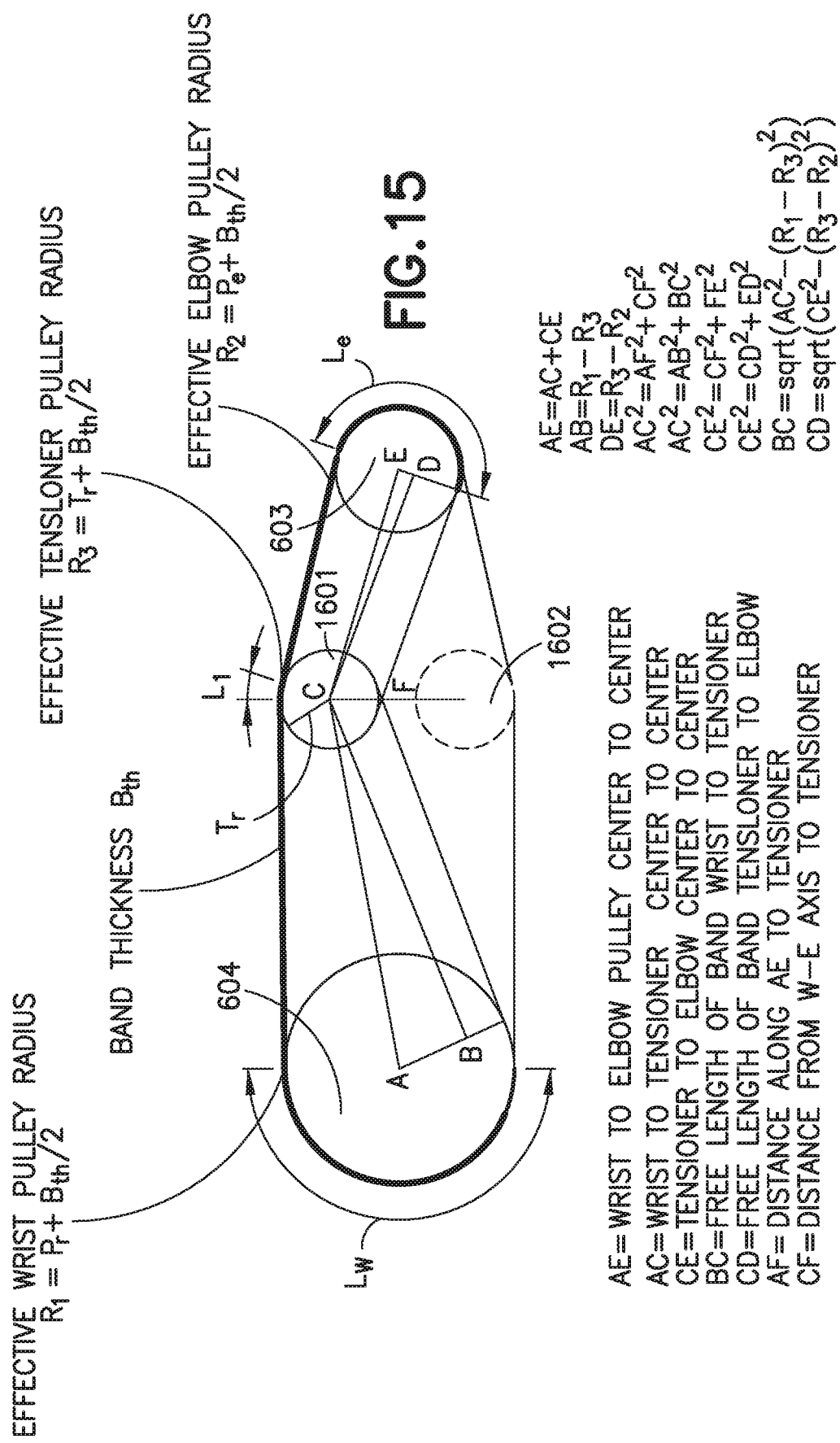
FIG. 15 is a schematic illustration of a portion of a substrate transport in accordance with one or more aspects of the disclosed embodiment.

The formula for thermal expansion in one dimension can be written as $$L_{final} = L_{initial} * Y * (t_{initial} - t_{final}) \quad [13]$$

Where L is the length of material, y is the material specific coefficient of thermal expansion and t is temperature. Based on equations [13] and [12], the initial and final band lengths for any given temperature change can be determined. For arms 110, 120 where the upper arm 110U, 120U and forearm 110F, 120F material has a different coefficient of thermal expansion than the materials of the pulley(s) or band(s) located therein, there will be a mismatch in the growth rate between the arm length and the band lengths. Referring to FIGS. 15-16 the following are noted The effective tensioner pulley radius R3 is $$R3 = Tr + Bth/2 \quad [14]$$

AE=wrist to elbow pulley center to center distance
AC=wrist to tensioner center to center distance
CE=tensioner to elbow center to center distance
BC=free length of band from the wrist to the tensioner
CD=free length of band from the tensioner to the elbow
AF=distance along AE to the tensioner
CF=distance from wrist-elbow axes to the tensioner
where $$AE = AC + CE \quad [14]$$

$$AB = R1 - R3 \quad [15]$$

$$DE = R3 - R1 \quad [16]$$

$$AC^2 = AF^2 + CF^2 \quad [17]$$

$$AC^2 = AB^2 + BC^2 \quad [18]$$

$$CE^2 = CF^2 + FE^2 \quad [19]$$

$$CE^2 = CD^2 + DE^2 \quad [20]$$

$$BC = \sqrt{AC^2 - (R1-R3)^2} \quad [21]$$

$$CD = \sqrt{CE^2 - (R3-R2)^2} \quad [22]$$

The band wrap around the wrist Lw can be calculated as $$Lw = R1\pi + R1\left(\frac{\pi}{2} - \cos^{-1}\left(\frac{R1-R3}{AC}\right)\right) \quad [23]$$

The band wrap around the elbow Le can be calculated as $$Le = R2\pi - R2\left(\frac{\pi}{2} - \cos^{-1}\left(\frac{R3-R2}{CE}\right)\right) \quad [24]$$

The band wrap around the tensioner L1 can be calculated as $$L1 = R3\left(\cos^{-1}\left(\frac{R3-R2}{CE}\right) - \cos^{-1}\left(\frac{R1-R3}{AC}\right)\right) \quad [25]$$

Where the total band segment length is $$L_{band} = Lw + L1 + Le + BC + DE \quad [26]$$

In one aspect, the material of the tensioner frame 1605 and the at least two tensioner pulleys 1601, 1602 of the passive band tensioner 1600 are based on the above equations [1]-[26] so that at least the material of one or more of the tensioner bar 1605 and the at least two tensioner pulleys 1601, 1602 have different rates of thermal expansion than the forearm 110F and pulleys 603, 604 to compensate for the thermal expansion of the forearm 110F, pulleys 603, 604 and band segments 660A, 660B where a constant tension of the band segments 660A, 66GB is maintained. In other aspects, the geometry of the tensioner bar 1605 and pulleys 1601, 1602 located thereon may also compensate for the thermal expansion of the forearm 110F, pulleys 603, 604 and band segments 660A, 660B and at least in part effect maintaining the constant tension of the band segments 660A, 660B.

In another aspect, referring to FIGS. 17A and 17B the passive band tensioner 1700 is located substantially between pulleys 603, 604 of the forearm 110F and includes a single pulley 1701 mounted to a frame 1705F which has a substantially straight configuration. One end of the frame 1705F is rotatably mounted to the forearm 110F in the manner described above with respect to passive band tensioner 1600 while the pulley 1701 is mounted at the other end of the frame 1705F. Here it is noted that AE=the wrist to elbow pulley center to center distance
AC=the wrist to tensioner center to center distance
CE=the tensioner to elbow center to center distance BC=the free length of the band segment from the wrist to the tensioner DE=the free length of the band segment from the tensioner to the elbow Where R1, R2 and R3 are as noted above in equations [1], [2] and [14], and $$AE = AC + CE \quad [27]$$

$$AB = R1 - R3 \quad [28]$$

$$CD = R3 - R2 \quad [29]$$

$$AC^2 = AB^2 + BC^2 \quad [30]$$

$$CE^2 = CD^2 + DE^2 \quad [31]$$

$$BC = \sqrt{AC^2 - (R1 - R3)^2} \quad [32]$$

$$DE = \sqrt{CE^2 - (R3 - R2)^2} \quad [33]$$

As noted above, the material of one or more of the tensioner frame 1705F and the pulleys 1701 of the passive band tensioner 1700 have different rates of thermal expansion than one or more of the forearm 110F, pulleys 603, 604 and band segments 660A, 660B to compensate for the thermal expansion of the forearm 110F, pulleys 603, 604 and band segments 660A, 660B where a constant tension of the band segments 660A, 660B is maintained. In other aspects, the geometry of the tensioner frame 1705F and pulley 1701 located thereon may also compensate for the thermal expansion of the forearm 110F, pulleys 603, 604 and band segments 660A, 660B and at least in part effect maintaining the constant tension of the band segments 660A, 660B.

In one aspect, the passive band tensioners 1600, 1700 minimize a sensitivity of the band segment tension (of the band segments in the segmented transmission loops of the transport apparatus 100, 100A) with the thermal expansion of the SCARA arms 110, 120. As noted above, in one aspect, the material of one or more of the pulleys 1601, 1602, 1701 of the passive band tensioners 1600, 1700 may be selected to compensate for the thermal expansion of the SCARA arms 110, 120 where in one aspect the coefficient of thermal expansion of the pulleys 1601, 1602, 1701 may be less than the coefficient of thermal expansion of the arm links (e.g. upper arms 110U, 120U and forearms 110F, 120F and the pulleys located therein). In other aspects, the material of the frame 1605F, 1705F of the passive band tensioners 1600, 1700 may be selected (e.g. in combination with or independent of the selection of the pulley 1601, 1602, 1701 material) to compensate for the thermal expansion of the SCARA arms 110, 120 where in one aspect the coefficient of thermal expansion of the frame 1605F, 1705F may be less than the coefficient of thermal expansion of the arm links (e.g. upper arms 110U, 120U and forearms 110F, 120F and the pulleys located therein). In one aspect, the material of the frame 1605F, 1705F may be a composite or segmented material so that the coefficient of thermal expansion varies along a length of the frame 1605F, 1705F to bias the thermal expansion compensation provided by the passive band tensioner 1600, 1700 to the higher temperatures experienced at the wrist of the arms 110, 120. In still other aspects, the material for one or more of the shoulder, elbow and/or wrist pulleys 600-606 of may be chosen to compensate for the thermal expansion of the arms (in addition to or independent of the passive band tensioners 1600, 1700) so that, a constant tension is maintained in the band segments of the respective segmented transmission loops.

In accordance with one or more aspects of the disclosed embodiment a substrate processing apparatus comprises:

a frame;

a first SCARA arm connected to the frame, the first SCARA arm having an end effector and is configured to extend and retract along a first radial axis;

a second SCARA arm connected to the frame, the second SCARA arm having an end effector and is configured to extend an a retract along a second radial axis;

a drive section coupled to the first and second SCARA arms, the drive section including a splitting drive pulley rotatably mounted to rotate, as a unit, at an axis of rotation of the drive section, which axis of rotation is shared by the first and second SCARA arms, the splitting drive pulley being coupled to at least two idler pulleys by respective segmented transmission loops of separate band segments so that the splitting drive pulley is a common pulley splitting one degree of freedom of the drive section between at least two idler pulleys so as to commonly drive the at least two idler pulleys from the one degree of freedom of the drive section, wherein at least one band of each respective transmission loop share a common band interface level.

In accordance with one or more aspects of the disclosed embodiment the drive pulley has two shared band interface levels.

In accordance with one or more aspects of the disclosed embodiment the drive pulley has three band interface levels, at least one of the three band interface levels being a shared band interface level.

In accordance with one or more aspects of the disclosed embodiment the drive pulley is a segmented pulley having a removable segment that includes at least one of the three band interface levels so as to remove the removable segment from the axis of rotation with corresponding ones of the segmented transmission loops attached thereto, where a mating segment of the drive pulley, that mates with the removable segment, remains on the axis of rotation with corresponding ones of the segmented transmission loops attached thereto.

In accordance with one or more aspects of the disclosed embodiment one of the at least two idler pulleys is connected to the first SCARA arm to effect extension and retraction of the first SCARA arm and another of the at least two idler pulleys is connected to the second SCARA arm to effect extension and retraction of the second SCARA arm.

In accordance with one or more aspects of the disclosed embodiment one of the at least two idler pulleys is disposed at an elbow axis of rotation of each of the first and second SCARA arms and the drive pulley is disposed at a shoulder axis of rotation of the first and second SCARA arms.

In accordance with one or more aspects of the disclosed embodiment the first and second SCARA arms are configured so as to effect independent extension and retraction of each of the first and second SCARA arms.

In accordance with one or more aspects of the disclosed embodiment an axis of extension and retraction of the first SCARA arm is angled with respect to an axis of extension and retraction of the second SCARA arm.

In accordance with one or more aspects of the disclosed embodiment an axis of extension and retraction of the first SCARA arm and an axis of extension and retraction of the second SCARA arm are stacked one above the other over a shoulder axis of rotation of the first and second SCARA arms.

In accordance with one or more aspects of the disclosed embodiment each of the separate band segments has a band anchor point on the drive pulley that defines a band engagement arc with the drive pulley so that the included angle of rotation, between the band engagement arc and a point at which the band anchor point forms a tangent between the respective band segment and the drive pulley, is about 90 degrees or less.

In accordance with one or more aspects of the disclosed embodiment the substrate processing apparatus further comprises a controller configured to rotate a degree of freedom of the drive section so as to change an angle between band anchor points.

In accordance with one or more aspects of the disclosed embodiment the drive pulley includes pulley segments that are movable relative to each other, each pulley segment having at least one band anchor point mounted thereto, the controller being configured to cause relative rotation between the pulley segments to effect the change in the angle between the band anchor points.

In accordance with one or more aspects of the disclosed embodiment a substrate processing apparatus comprises:
 a frame;
 a first SCARA arm connected to the frame, the first SCARA arm having an end effector and is configured to extend and retract along a first radial axis;
 a second SCARA arm connected to the frame, the second SCARA arm having an end effector and is configured to extend an a retract along a second radial axis;
 a drive section coupled to the first and second SCARA arms;
 a splitting drive pulley coupled to the drive section and rotatably mounted to rotate, as a unit, at an axis of rotation of the drive section, which axis of rotation is shared by the first and second SCARA arms,
 at first idler pulley coupled to the splitting drive pulley by a segmented first transmission loop of separate band segments extending between the first idler pulley and the splitting drive pulley; and
 a second idler pulley coupled to the splitting drive pulley by a segmented second transmission loop of separate band segments extending between the second idler pulley and the splitting drive pulley so that the drive pulley is a common pulley splitting one degree of freedom of the drive section between the first and second idler pulleys so as to commonly drive the first and second idler pulleys from the one degree of freedom of the drive section;
 wherein
 the second idler pulley interfaces with the splitting drive pulley on band engagement arcs that are different than the band engagement arcs on which the first idler pulley interfaces with the splitting drive pulley,
 and at least one band of each of the first and second transmission loops share a common band interface level.

In accordance with one or more aspects of the disclosed embodiment the drive pulley has two shared band interface levels.

In accordance with one or more aspects of the disclosed embodiment the drive pulley has three band interface levels, at least one of the three band interface levels being a shared band interface level.

In accordance with one or more aspects of the disclosed embodiment the drive pulley is a segmented pulley having a removable segment that includes at least one of the three band interface levels so as to remove the removable segment from the axis of rotation with corresponding ones of the segmented first or second transmission loops attached thereto, where a mating segment of the drive pulley, that mates with the removable segment, remains on the axis of rotation with corresponding ones of the segmented first or second transmission loops attached thereto.

In accordance with one or more aspects of the disclosed embodiment the first idler pulley is connected to the first SCARA arm to effect extension and retraction of the first SCARA arm and the second idler pulley is connected to the second SCARA arm to effect extension and retraction of the second SCARA arm.

In accordance with one or more aspects of the disclosed embodiment the first idler pulleys is disposed at an elbow axis of rotation of the first SCARA arm, the second idler pulley is disposed at an elbow axis of the second SCARA arm and the drive pulley is disposed at a shoulder axis of rotation of the first and second SCARA arms.

In accordance with one or more aspects of the disclosed embodiment the first and second SCARA arms are configured so as to effect independent extension an a retraction of each of the first and second SCARA arms.

In accordance with one or more aspects of the disclosed embodiment an axis of extension and retraction of the first SCARA arm is angled with respect to an axis of extension and retraction of the second SCARA arm.

In accordance with one or more aspects of the disclosed embodiment an axis of extension and retraction of the first SCARA arm and an axis of extension an a retraction of the second SCARA arm are stacked one above the other over a shoulder axis of rotation of the first and second SCARA arms.

In accordance with one or more aspects of the disclosed embodiment each of the separate band segments has a band anchor point on the drive pulley that defines a respective band engagement arc with the drive pulley so that the included angle of rotation, between the respective band engagement arc and a point at which the band anchor point forms a tangent between the respective band segment and the drive pulley, is about 90 degrees or less.

In accordance with one or more aspects of the disclosed embodiment the substrate processing apparatus further comprises a controller configured to rotate a degree of freedom of the drive section so as to change an angle between band anchor points.

In accordance with one or more aspects of the disclosed embodiment the drive pulley includes pulley segments that are movable relative to each other, each pulley segment having at least one band anchor point mounted thereto, the controller being configured to cause relative rotation between the pulley segments to effect the change in the angle between the band anchor points.

In accordance with one or more aspects of the disclosed embodiment a method for processing substrates comprises:
 providing a substrate processing apparatus having
 a frame,
 a first SCARA arm connected to the frame, the first SCARA arm having an end effector and is configured to extend and retract along a first radial axis,
 a second SCARA arm connected to the frame, the second SCARA arm having an end effector and is configured to extend an a retract along a second radial axis, and
 a drive section coupled to the first and second SCARA arms, the drive section including
 a splitting drive pulley rotatably mounted to rotate, as a unit, at an axis of rotation of the drive section, which axis of rotation is shared by the first and second SCARA arms, and
 the drive pulley being coupled to at least two idler pulleys by respective segmented transmission loops of separate band segments so that the drive pulley is a common pulley to the at least two idler pulleys; and splitting one degree of freedom of the drive section between at least two idler pulleys so as to commonly drive the at least two idler pulleys from the one degree of freedom of the drive section;

wherein at least one band of each respective transmission loop share a common band interface level.

C1. In accordance with one or more aspects of the disclosed embodiment the method further comprises interfacing the separate band segments with the drive pulley at two shared band interface levels.

In accordance with one or more aspects of the disclosed embodiment the method further comprises interfacing the separate band segments with the drive pulley at three band interface levels where one of the three band interface levels is a shared band interface level.

In accordance with one or more aspects of the disclosed embodiment the method further comprises providing the drive pulley with a removable segment that includes at least one of the three band interface levels so as to remove the removable segment from the axis of rotation with corresponding ones of the segmented transmission loops attached thereto, where a mating segment of the drive pulley, that mates with the removable segment, remains on the axis of rotation with corresponding ones of the segmented transmission loops attached thereto.

In accordance with one or more aspects of the disclosed embodiment the method further comprises effecting extension and retraction of the first SCARA arm with one of the at least two idler pulleys and effecting extension and retraction of the second SCARA arm with another of the at least two idler pulleys.

In accordance with one or more aspects of the disclosed embodiment the method further comprises extending and retracting the first and second SCARA arms independently from each other.

In accordance with one or more aspects of the disclosed embodiment the method further comprises extending and retracting the first SCARA arm along an axis that is angled relative to an axis of extension and retraction of the second SCARA arm.

In accordance with one or more aspects of the disclosed embodiment the method further comprises extending and retracting the first and second SCARA arm along axes that are stacked one above the other over a shoulder axis of the first and second SCARA arm.

In accordance with one or more aspects of the disclosed embodiment the method further comprises rotating a degree of freedom of the drive section so as to change an angle between anchor points of the separate band segments on the splitting drive pulley.

In accordance with one or more aspects of the disclosed embodiment the method further comprises causing relative movement, with a controller coupled to the drive section, between pulley segments of the splitting drive pulley to effect the change in the angle between anchor points of the separate band segments on the splitting drive pulley.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A substrate processing apparatus comprising:
   a frame;
   a first SCARA arm connected to the frame, the first SCARA arm having an end effector and is configured to extend and retract along a first radial axis;
   a second SCARA arm connected to the frame, the second SCARA arm having an end effector and is configured to extend and retract along a second radial axis;
   a drive section coupled to the first and second SCARA arms, the drive section including
      a splitting drive pulley rotatably mounted to rotate about ±90 degrees, as a unit, at an axis of rotation of the drive section, which axis of rotation is shared by the first and second SCARA arms,
      the splitting drive pulley being coupled to at least two idler pulleys by respective segmented transmission loops of separate band segments so that the splitting drive pulley admits the ±90 degree rotation without overlap of the separate band segments of the segmented transmission loops and so that the splitting drive pulley is a common pulley splitting motive force of one degree of freedom of the drive section between the at least two idler pulleys so as to commonly drive the at least two idler pulleys from the one degree of freedom of the drive section,
      wherein a respective coupling of each band segment with the splitting drive pulley defines a respective band interface level and at least one band segment of each respective transmission loop share a common band interface level.

2. The substrate processing apparatus of claim 1, wherein the splitting drive pulley has two shared band interface levels.

3. The substrate processing apparatus of claim 1, wherein the splitting drive pulley has three band interface levels, at least one of the three band interface levels being a shared band interface level.

4. The substrate processing apparatus of claim 3, wherein the splitting drive pulley is a segmented pulley having a removable segment that includes at least one of the three band interface levels so as to remove the removable segment from the axis of rotation with corresponding ones of the segmented transmission loops attached thereto, where a mating segment of the splitting drive pulley, that mates with the removable segment, remains on the axis of rotation with corresponding ones of the segmented transmission loops attached thereto.

5. The substrate processing apparatus of claim 1, wherein one of the at least two idler pulleys is connected to the first SCARA arm to effect extension and retraction of the first SCARA arm and another of the at least two idler pulleys is connected to the second SCARA arm to effect extension and retraction of the second SCARA arm.

6. The substrate processing apparatus of claim 1, wherein one of the at least two idler pulleys is disposed at an elbow axis of rotation of each of the first and second SCARA arms and the splitting drive pulley is disposed at a shoulder axis of rotation of the first and second SCARA arms, the shoulder axis of rotation being coaxial with the axis of rotation of the drive section.

7. The substrate processing apparatus of claim 1, wherein the first and second SCARA arms are configured so as to effect independent extension and retraction of each of the first and second SCARA arms.

8. The substrate processing apparatus of claim 1, wherein the first radial axis of the first SCARA arm is angled with respect to the second radial axis of the second SCARA arm.

9. The substrate processing apparatus of claim 1, wherein the first radial axis of the first SCARA arm and the second radial axis of the second SCARA arm are stacked one above the other over a shoulder axis of rotation of the first and second SCARA arms.

10. The substrate processing apparatus of claim 1, wherein each of the separate band segments has a band anchor point on the splitting drive pulley that defines a band engagement arc with the splitting drive pulley so that the included angle of rotation, between the band engagement arc and a point at which the band anchor point forms a tangent between the respective band segment and the splitting drive pulley, is about 90 degrees or less.

11. The substrate processing apparatus of claim 10, further comprising a controller configured to rotate an output shaft of the drive section in a direction of the one degree of freedom of the drive section so as to change an angle between band anchor points.

12. The substrate processing apparatus of claim 11, wherein the splitting drive pulley includes pulley segments that are movable relative to each other, each pulley segment having at least one band anchor point mounted thereto, the controller being configured to cause relative rotation between the pulley segments to effect the change in the angle between the band anchor points.

13. A substrate processing apparatus comprising:
a frame;
a first SCARA arm connected to the frame, the first SCARA arm having an end effector and is configured to extend and retract along a first radial axis;
a second SCARA arm connected to the frame, the second SCARA arm having an end effector and is configured to extend and retract along a second radial axis;
a drive section coupled to the first and second SCARA arms;
a splitting drive pulley coupled to the drive section and rotatably mounted to rotate about ±90 degrees, as a unit, at an axis of rotation of the drive section, which axis of rotation is shared by the first and second SCARA arms,
a first idler pulley coupled to the splitting drive pulley by a segmented first transmission loop of separate band segments extending between the first idler pulley and the splitting drive pulley; and
a second idler pulley coupled to the splitting drive pulley by a segmented second transmission loop of separate band segments extending between the second idler pulley and the splitting drive pulley so that the splitting drive pulley is a common pulley splitting motive force of one degree of freedom of the drive section between the first and second idler pulleys so as to commonly drive the first and second idler pulleys from the one degree of freedom of the drive section;
wherein
the second idler pulley interfaces with the splitting drive pulley on band engagement arcs that are different than the band engagement arcs on which the first idler pulley interfaces with the splitting drive pulley,
a respective coupling of each band segment with the splitting drive pulley defines a respective band interface level and at least one band segment of each of the first and second transmission loops share a common band interface level, and
the splitting drive pulley admits the ±90 degree rotation without overlap of the separate band segments of the segmented first and second transmission loops.

14. The substrate processing apparatus of claim 13, wherein the splitting drive pulley has two shared band interface levels.

15. The substrate processing apparatus of claim 13, wherein the splitting drive pulley has three band interface levels, at least one of the three band interface levels being a shared band interface level.

16. The substrate processing apparatus of claim 15, wherein the splitting drive pulley is a segmented pulley having a removable segment that includes at least one of the three band interface levels so as to remove the removable segment from the axis of rotation with corresponding ones of the segmented first or second transmission loops attached thereto, where a mating segment of the splitting drive pulley, that mates with the removable segment, remains on the axis of rotation with corresponding ones of the segmented first or second transmission loops attached thereto.

17. The substrate processing apparatus of claim 13, wherein the first idler pulley is connected to the first SCARA arm to effect extension and retraction of the first SCARA arm and the second idler pulley is connected to the second SCARA arm to effect extension and retraction of the second SCARA arm.

18. The substrate processing apparatus of claim 13, wherein the first idler pulleys is disposed at an elbow axis of rotation of the first SCARA arm, the second idler pulley is disposed at an elbow axis of the second SCARA arm and the splitting drive pulley is disposed at a shoulder axis of rotation of the first and second SCARA arms, the shoulder axis of rotation being coaxial with the axis of rotation of the drive section.

19. The substrate processing apparatus of claim 13, wherein the first and second SCARA arms are configured so as to effect independent extension and retraction of each of the first and second SCARA arms.

20. The substrate processing apparatus of claim 13, wherein the first radial axis of the first SCARA arm is angled with respect to the second radial axis of the second SCARA arm.

21. The substrate processing apparatus of claim 13, wherein the first radial axis of the first SCARA arm and the second radial axis of the second SCARA arm are stacked one above the other over a shoulder axis of rotation of the first and second SCARA arms.

22. The substrate processing apparatus of claim 13, wherein each of the separate band segments has a band anchor point on the splitting drive pulley that defines a respective band engagement arc with the splitting drive pulley so that the included angle of rotation, between the respective band engagement arc and a point at which the band anchor point forms a tangent between the respective band segment and the splitting drive pulley, is about 90 degrees or less.

23. The substrate processing apparatus of claim 22, further comprising a controller configured to rotate a an output shaft of the drive section in a direction of the one degree of freedom of the drive section so as to change an angle between band anchor points.

24. The substrate processing apparatus of claim 23, wherein the splitting drive pulley includes pulley segments that are movable relative to each other, each pulley segment having at least one band anchor point mounted thereto, the controller being configured to cause relative rotation between the pulley segments to effect the change in the angle between the band anchor points.

25. A method for processing substrates, the method comprising:
providing a substrate processing apparatus having
a frame,
a first SCARA arm connected to the frame, the first SCARA arm having an end effector and is configured to extend and retract along a first radial axis,
a second SCARA arm connected to the frame, the second SCARA arm having an end effector and is configured to extend and retract along a second radial axis, and
a drive section coupled to the first and second SCARA arms, the drive section including
a splitting drive pulley rotatably mounted to rotate about ±90 degrees, as a unit, at an axis of rotation of the drive section, which axis of rotation is shared by the first and second SCARA arms, and
the splitting drive pulley being coupled to at least two idler pulleys by respective segmented transmission loops of separate band segments so that the splitting drive pulley admits the ±90 degree rotation without overlap of the segmented transmission loops and so that the splitting drive pulley is a common pulley to the at least two idler pulleys; and
splitting motive force of one degree of freedom of the drive section between the at least two idler pulleys so as to commonly drive the at least two idler pulleys from the one degree of freedom of the drive section;
wherein a respective coupling of each band segment with the splitting drive pulley defines a respective band interface level and at least one band segment of each respective transmission loop share a common band interface level.

26. The method of claim 25, further comprising interfacing the separate band segments with the splitting drive pulley at two shared band interface levels.

27. The method of claim 25, further comprising interfacing the separate band segments with the splitting drive pulley at three band interface levels where one of the three band interface levels is a shared band interface level.

28. The method of claim 27, further comprising providing the splitting drive pulley with a removable segment that includes at least one of the three band interface levels so as to remove the removable segment from the axis of rotation with corresponding ones of the segmented transmission loops attached thereto, where a mating segment of the splitting drive pulley, that mates with the removable segment, remains on the axis of rotation with corresponding ones of the segmented transmission loops attached thereto.

29. The method of claim 25, further comprising effecting extension and retraction of the first SCARA arm with one of the at least two idler pulleys and effecting extension and retraction of the second SCARA arm with another of the at least two idler pulleys.

30. The method of claim 25, further comprising extending and retracting the first and second SCARA arms independently from each other.

31. The method of claim 25, further comprising extending and retracting the first SCARA arm along the first radial axis that is angled relative to the second radial axis of the second SCARA arm.

32. The method of claim 25, further comprising extending and retracting the first and second SCARA arm along axes that are stacked one above the other over a shoulder axis of the first and second SCARA arm.

33. The method of claim 25, further comprising rotating an output shaft of the drive section in a direction of the one degree of freedom of the drive section so as to change an angle between anchor points of the separate band segments on the splitting drive pulley.

34. The method of claim 33, further comprising causing relative movement, with a controller coupled to the drive section, between pulley segments of the splitting drive pulley to effect the change in the angle between anchor points of the separate band segments on the splitting drive pulley.

* * * * *